United States Patent
Arai et al.

(10) Patent No.: US 10,475,917 B2
(45) Date of Patent: Nov. 12, 2019

(54) MOSFET

(71) Applicant: SHINDENGEN ELECTRIC MANUFACTURING CO., LTD., Chiyoda-ku, Tokyo (JP)

(72) Inventors: Daisuke Arai, Saitama (JP); Shigeru Hisada, Saitama (JP); Mizue Kitada, Saitama (JP); Takeshi Asada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/985,624

(22) Filed: May 21, 2018

(65) Prior Publication Data

US 2019/0165161 A1 May 30, 2019

(30) Foreign Application Priority Data

Nov. 28, 2017 (JP) ................. 2017-227390

(51) Int. Cl.
*H01L 29/78* (2006.01)
*H01L 29/10* (2006.01)
*H01L 29/06* (2006.01)

(52) U.S. Cl.
CPC ...... *H01L 29/7813* (2013.01); *H01L 29/0634* (2013.01); *H01L 29/1095* (2013.01)

(58) Field of Classification Search
CPC ............. H01L 29/7813; H01L 29/0634; H01L 29/1095

(Continued)

(56) References Cited

U.S. PATENT DOCUMENTS

2003/0178670 A1* 9/2003 Fried ................. H01L 21/28273
257/315
2010/0155773 A1* 6/2010 Parthasarathy ....... H01L 29/407
257/139

(Continued)

FOREIGN PATENT DOCUMENTS

| JP | 2012-64660 A | 3/2012 |
|----|----|----|
| JP | 2012-143060 A | 7/2012 |

OTHER PUBLICATIONS

Daisuke Arai et al, "Dependence of Switching Waveform on Charge Imbalance in Superjunction MOSFET used in Inductive Load Circuit", Proceedings of The 29th International Symposium on Power Semiconductor Devices & ICs, May 28, 2017, 487-490 pages, Japan,18pp.

*Primary Examiner* — Bo Fan
(74) *Attorney, Agent, or Firm* — Hauptman Ham, LLP

(57) ABSTRACT

A MOSFET includes a semiconductor base substrate where a super junction structure is formed of an n-type column region and a p-type column region. A total amount of a dopant in the n-type column region is set to a value greater than a total amount of a dopant in the p-type column region. The MOSFET is configured to be operated during a period from a point of time when a drain current starts to decrease to a point of time when the drain current becomes 0 for the first time in response to turning off of the MOSFET such that a first period during which the drain current is decreased, a second period during which the drain current is increased or the drain current becomes constant, and a third period during which the drain current is decreased again occur in this order.

8 Claims, 13 Drawing Sheets

(58) Field of Classification Search
USPC .......................... 257/139, 330, 347, 315, 255
See application file for complete search history.

(56) References Cited

U.S. PATENT DOCUMENTS

2011/0006369 A1* 1/2011 Sonsky ............. H01L 29/66795
257/347
2015/0091083 A1* 4/2015 Poelzl ................... H01L 29/407
257/330

* cited by examiner

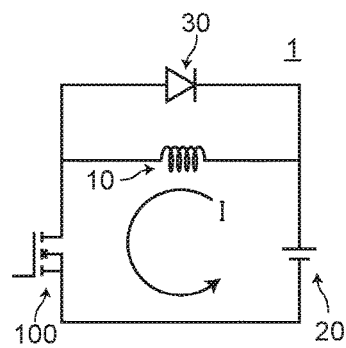
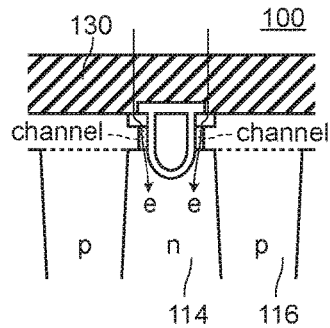
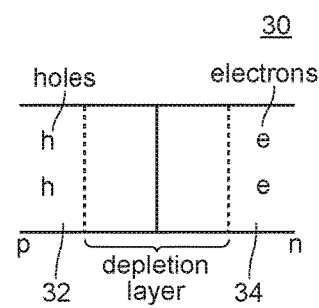
FIG.5A     FIG.5B     FIG.5C
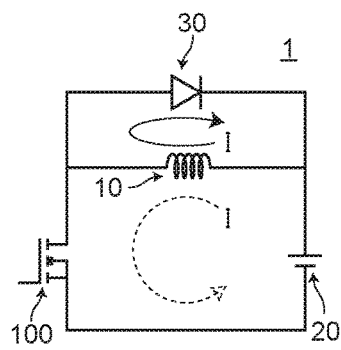
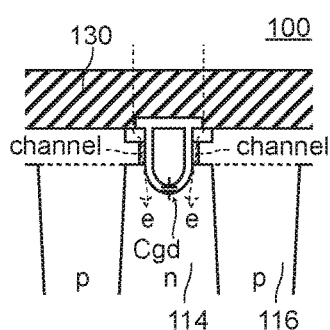
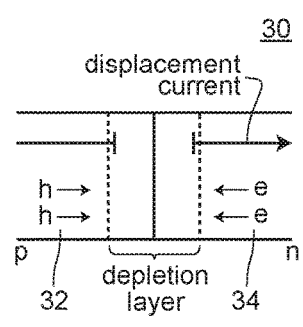
FIG.6A     FIG.6B     FIG.6C
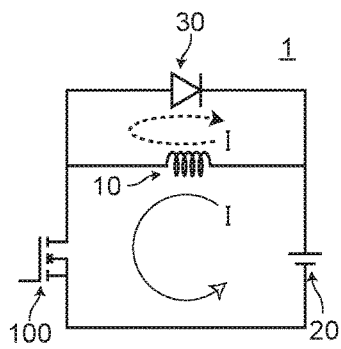
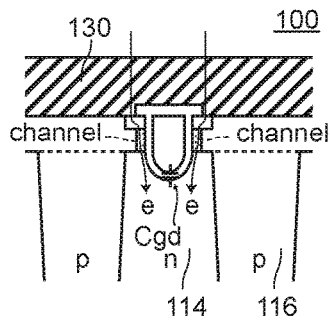
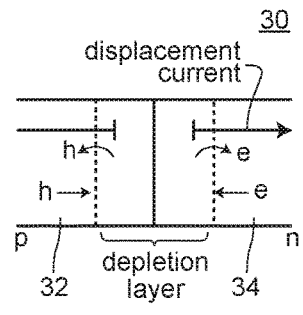
FIG.7A     FIG.7B     FIG.7C

MOSFET

RELATED APPLICATIONS

The present application claims priority to Japanese Patent Application No. 2017-227390, filed Nov. 28, 2017, the disclosure of which is hereby incorporated by reference herein in its entirety.

TECHNICAL FIELD

The present invention relates to a Metal-Oxide Semiconductor Field-Effect Transistor (MOSFET).

BACKGROUND ART

Conventionally, there has been known a power conversion circuit which includes a MOSFET having a semiconductor base substrate where a super junction structure is formed (see patent document 1, for example).

Conventionally, there has been known a MOSFET which includes a semiconductor base substrate where a super junction structure is formed of an n-type column region and a p-type column region (see patent document 1, for example).

As shown in FIG. 21, a conventional MOSFET 900 includes: a semiconductor base substrate 910 having n-type column regions 914, p-type column regions 916, a p-type base region 918 formed on surfaces of the n-type column regions 914 and surfaces of the p-type column regions 916, and an n-type source region 920 formed on a surface of the base region 918 and where a super junction structure is formed of the n-type column regions 914 and the p-type column regions 916; trenches 922 which are formed so as to reach a depth position deeper than a deepest portion of the base region 918 in regions where the n-type column region 914 is positioned as viewed in a plan view and a part of the source region 920 is exposed on an inner peripheral surface of the trench 922; and gate electrodes 926 which are embedded in the inside of the trenches 922 through gate insulation films 924 formed on inner peripheral surfaces of the trenches 922.

In this specification, "super junction structure" means a structure where an n-type column region and a p-type column region are alternately and repeatedly arranged as viewed in a predetermined cross section.

In the conventional MOSFET 900, the n-type column region 914 and the p-type column region 916 are formed such that a total amount of a dopant in the n-type column region 914 is equal to a total amount of a dopant in the p-type column region 916. That is, the n-type column region 914 and the p-type column region 916 are well-balanced with each other in terms of a charge.

The conventional MOSFET 900 includes the semiconductor base substrate 910 where the super junction structure is formed of the n-type column regions 914 and the p-type column regions 916 thus providing a switching element which has a low ON resistance and a high withstand voltage.

PRIOR ART DOCUMENT

Patent Document
  Patent document 1: JP-A-2012-64660
  Patent document 2: JP-A-2012-143060

SUMMARY OF INVENTION

Problem to be Solved by the Invention

The above-mentioned conventional MOSFET 900 is used as a switching element having a low ON resistance and a high withstand voltage as described above and hence, the use of such a MOSFET in a power conversion circuit (see patent document 2, for example) is considered. However, in the case where the conventional MOSFET is used in the power conversion circuit, when the MOSFET is turned off, there is a tendency for a surge voltage to be increased. Accordingly, it is difficult for the MOSFET 900 to satisfy a standard for a surge voltage which a power conversion circuit is required to possess and hence, there exists a drawback that the applying of the MOSFET 900 to various power conversion circuits is difficult.

Further, recently, in the technical field of MOSFETs, there has been a demand for a MOSFET where a turn-off loss which occurs when the MOSFET is turned off is reduced.

Accordingly, the present invention has been made in view of the above-mentioned circumstances, and it is an object of the present invention to provide a MOSFET capable of being applied to various power conversion circuits and capable of reducing a turn-off loss when a MOSFET is turned off, and a power conversion circuit which uses the MOSFET.

Solution to Problem

[1] According to the present invention, there is provided a MOSFET used in a power conversion circuit which includes a power source and the MOSFET for controlling an electric current supplied from the power source, wherein the MOSFET includes a semiconductor base substrate having an n-type column region and a p-type column region, the n-type column region and the p-type column region forming a super junction structure, a total amount of a dopant in the p-type column region is set to a value which falls within a range of 1.00 to 1.03 times as much as a total amount of a dopant in the n-type column region, and the MOSFET is configured to be operated during a period from a point of time when a drain current starts to decrease to a point of time when the drain current becomes 0 for the first time in response to turning off of the MOSFET such that a first period during which the drain current is decreased, a second period during which the drain current is increased or the drain current becomes constant, and a third period during which the drain current is decreased again occur in this order.

In this specification, "the drain current becomes constant" means a state where a waveform of the drain current is leveled off" as a whole. In other words, "the drain current becomes constant" means a state where a gradient of the drain current with respect to time becomes 0 or substantially 0 as a whole. Accordingly, even in a case where fine fluctuation is found in a gradient of a drain current such as a case where fine amplitude is found in the second period, provided that a waveform of the drain current is (substantially) leveled off" as a whole, it is safe to say that the drain current is constant.

[2] According to the MOSFET of the present invention, it is preferable that a decrease amount of the drain current per unit time during the third period be set to a value smaller than a decrease amount of the drain current per unit time during the first period.

[3] According to the MOSFET of the present invention, it is preferable that the semiconductor base substrate further include: a p-type base region formed on a surface of the n-type column region and a surface of the p-type column region; and an n-type source region formed on a surface of the base region, and the MOSFET be a trench-gate-type MOSFET which further includes: a trench where the trench is formed so as to reach a depth position deeper than a deepest portion of the base region in a region where the n-type column region is positioned as viewed in a plan view, and a portion of the source region is exposed on an inner peripheral surface of the trench; and a gate electrode embedded in the inside of the trench byway of a gate insulation film formed on the inner peripheral surface of the trench.

[4] According to the MOSFET of the present invention, it is preferable that the semiconductor base substrate further include: a p-type base region formed on a surface of a portion of the n-type column region and a whole surface of the p-type column region; and an n-type source region formed on a surface of the base region, and the MOSFET be a planar-gate-type MOSFET which further includes a gate electrode formed on the base region sandwiched between the source region and the n-type column region by way of a gate insulation film.

[5] According to the MOSFET of the present invention, it is preferable that the total amount of the dopant in the p-type column region be set to a value which falls within a range of 1.00 to 1.02 times as much as the total amount of the dopant in the n-type column region.

[6] According to the MOSFET of the present invention, it is preferable that the semiconductor base substrate further include an n-type surface high concentration diffusion region formed on a portion of the surface of the n-type column region where the base region is not formed.

[7] According to the MOSFET of the present invention, it is preferable that in the p-type column region, in a depth direction of the p-type column region, a width of the p-type column region be increased as the p-type column region extends from a deep portion of the p-type column region toward a surface of the p-type column region.

[8] According to the MOSFET of the present invention, it is preferable that in the p-type column region, in a depth direction of the p-type column region, dopant concentration in the p-type column region be increased as the p-type column region extends from a deep portion of the p-type column region toward a surface of the p-type column region.

[9] According to the present invention, there is provided a power conversion circuit including at least: a reactor; a power source which supplies an electric current to the reactor; the MOSFET according to any one of [1] to [8] for controlling an electric current supplied from the power source to the reactor, and a rectifier element which performs a rectifying operation of the electric current supplied from the power source to the reactor or an electric current from the reactor.

[10] According to the MOSFET of the present invention, it is preferable that the rectifier element be a fast recovery diode.

[11] According to the MOSFET of the present invention, it is preferable that the rectifier element be a built-in diode of the MOSFET.

[12] According to the MOSFET of the present invention, it is preferable that the rectifier element be a silicon-carbide Schottky barrier diode.

Advantageous Effects of the Present Invention

According to the MOSFET and the power conversion circuit of the present invention, a total amount of a dopant in the p-type column region is set to a value equal to or smaller than 1.03 times as much as a total amount of a dopant in the n-type column region, and the MOSFET is configured to be operated during a period from a point of time when a drain current starts to decrease to a point of time when the drain current becomes 0 for the first time in response to turning off of the MOSFET such that a first period during which the drain current is decreased, a second period during which the drain current is increased or the drain current becomes constant, and a third period during which the drain current is decreased again occur in this order. Accordingly, compared with the conventional MOSFET 900, a time until a current value of a drain current becomes 0 can be extended and, at the same time, a decrease amount of a drain current per unit time during the third period can be made relatively small (a gradient of a drain current can be made gentle). Accordingly, a surge voltage of the MOSFET can be made relatively small and hence, the MOSFET according to the present invention can easily satisfy a standard for a surge voltage which the power conversion circuit is required to possess. As a result, the MOSFET and the power conversion circuit according to the present invention are applicable to various power conversion circuits.

Further, since the MOSFET and the power conversion circuit according to the present invention are configured as described above, compared with the conventional MOSFET 900, a time until a drain-source voltage Vds becomes maximum can be extended and, at the same time, an increase amount per unit time of the drain-source voltage Vds until the drain-source voltage Vds becomes maximum can be made small and hence, oscillation minimally occurs compared with the conventional MOSFET 900. Accordingly, it is unnecessary to incorporate a constitutional element such as a noise filter in the power conversion circuit for suppressing oscillation.

On the other hand, according to the MOSFET and the power conversion circuit of the present invention, a total amount of a dopant in the p-type column region is set to a value equal to or greater than 1.00 time as much as a total amount of a dopant in the n-type column region. Accordingly, a bump waveform does not become excessively large and hence, when the MOSFET is turned off, a time necessary for turning off the MOSFET can be shortened so that a turn-off loss can be reduced.

In this specification, "bump waveform" means a waveform of a drain current where, during a period from a point of time when the drain current starts to decrease to a point of time when the drain current becomes 0 for the first time in response to turning off of the MOSFET such that a first period during which the drain current is decreased, a second period during which the drain current is increased or the drain current becomes constant, and a third period during which the drain current is decreased again occur in this order. Ina case where the drain current becomes constant in the second period, the bump waveform may not be generated like a protrusion but appear like a step. In this specification, such a step-like waveform also forms the bump waveform.

The reason a total amount of a dopant in the p-type column region is set to a value equal to or greater than 1.00 time as much as a total amount of a dopant in the n-type column region is that, when a total amount of a dopant in the p-type column region is set to a value smaller than 1.00 time as much as a total amount of a dopant in the n-type column region, a bump waveform becomes large so that it is difficult to shorten a time necessary for turning off the MOSFET whereby it is difficult to reduce turn-off loss. On the other hand, the reason a total amount of a dopant in the p-type column region is set to a value equal to or smaller than 1.03 times as much as a total amount of a dopant in the n-type column region is that, when a total amount of a dopant in the p-type column region exceeds a value which is 1.03 times as much as a total amount of a dopant in the n-type column region, a bump waveform is not generated so that it is difficult to set a surge voltage of the MOSFET smaller than a surge voltage of the conventional MOSFET 900. Accordingly, it is difficult for the MOSFET to satisfy a standard for a surge voltage which the power conversion circuit is required to possess and hence, the application of the present invention to various power conversion circuits becomes difficult.

Further, according to the MOSFET of the present invention, the MOSFET includes the semiconductor base substrate where the super junction structure is formed of the n-type column region and the p-type column region and hence, it is possible to provide a switching element having a low ON resistance and a high withstand voltage in the same manner as the conventional MOSFET 900.

BRIEF DESCRIPTION OF DRAWINGS

FIG. 5A to FIG. 5C are views showing operational states of the power conversion circuit 1, the MOSFET 100, and a rectifier element 30 when the MOSFET 100 is in an ON state. FIG. 5A is the circuit diagram showing the operational state of the power conversion circuit 1, FIG. 5B is a view showing the operational state of the MOSFET 100, and FIG. 5C is a view showing the operational state of the rectifier element 30 (the same definition also being adopted by FIG. 6A to FIG. 9C).

FIG. 6A to FIG. 6C are views showing operational states of the power conversion circuit 1, the MOSFET 100, and the rectifier element 30 during a first period.

FIG. 7A to FIG. 7C are views showing operational states of the power conversion circuit 1, the MOSFET 100, and the rectifier element 30 during a second period.

In FIG. 10, symbol 40 indicates a load, and symbol 50 indicates a capacitor.

In FIG. 11, symbol 40 indicates a load, and symbol 50 indicates a capacitor.

FIG. 13A is the graph showing the time transition simulation result of the drain current Id, the drain-source voltage Vds, and the gate-source voltage Vgs when the MOSFET is turned off in the case of Just, FIG. 13B is the graph showing the time transition simulation result of the drain current Id, the drain-source voltage Vds, and the gate-source voltage Vgs when the MOSFET is turned off in the case of 1% p-type dopant rich, and FIG. 13C is the graph showing the time transition simulation result of the drain current Id, the drain-source voltage Vds, and the gate-source voltage Vgs when the MOSFET is turned off in the case of 2% p-type dopant rich.

FIG. 14A is the graph showing the time transition simulation result of the drain current Id, the drain-source voltage Vds, and the gate-source voltage Vgs when the MOSFET is turned off in the case of 3% p-type dopant rich, FIG. 14B is the graph showing the time transition simulation result of the drain current Id, the drain-source voltage Vds, and the gate-source voltage Vgs when the MOSFET is turned off in the case of 4% p-type dopant rich, and FIG. 14C is the graph showing the time transition simulation result of the drain current Id, the drain-source voltage Vds, and the gate-source voltage Vgs when the MOSFET is turned off in the case of 5% p-type dopant rich.

FIG. 17A is the graph showing the time transition simulation result of the drain current Id, the drain-source voltage Vds, and the gate-source voltage Vgs when the MOSFET is turned off in the case of Just, FIG. 17B is the graph showing the time transition simulation result of the drain current Id, the drain-source voltage Vds, and the gate-source voltage Vgs when the MOSFET is turned off in the case of 1% p-type dopant rich, and FIG. 17C is the graph showing the time transition simulation result of the drain current Id, the drain-source voltage Vds, and the gate-source voltage Vgs when the MOSFET is turned off in the case of 2% p-type dopant rich.

FIG. 18A is the graph showing the time transition simulation result of the drain current Id, the drain-source voltage Vds, and the gate-source voltage Vgs when the MOSFET is turned off in the case of 3% p-type dopant rich, FIG. 18B is the graph showing the time transition simulation result of the drain current Id, the drain-source voltage Vds, and the gate-source voltage Vgs when the MOSFET is turned off in the case of 4% p-type dopant rich, and FIG. 18C is the graph showing the time transition simulation result of the drain current Id, the drain-source voltage Vds, and the gate-source voltage Vgs when the MOSFET is turned off in the case of 5% p-type dopant rich.

DESCRIPTION OF EMBODIMENTS

Figure 1:
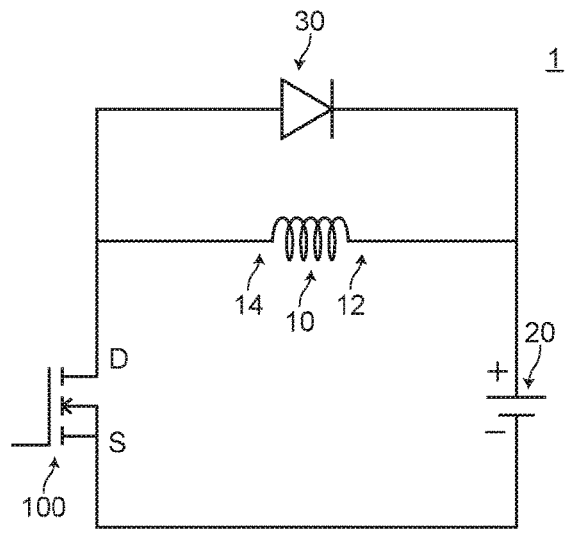
FIG. 1 is a circuit diagram showing a power conversion circuit 1 according to Embodiment 1.

Hereinafter, a MOSFET and a power conversion circuit according to the present invention are described in accordance with embodiments shown in the drawings. The respective drawings are schematic drawings, and do not always strictly reflect actual sizes of the MOSFET and the power conversion circuit.

Embodiment 1

1. Structure and Operation of Power Conversion Circuit 1 According to Embodiment 1

A power conversion circuit 1 according to Embodiment 1 is a chopper circuit which is a constitutional element such as a DC-DC converter or an inverter. The power conversion circuit 1 according to Embodiment 1 includes, as shown in FIG. 1, a reactor 10, a power source 20, a MOSFET 100 according to Embodiment 1, and a rectifier element 30.

The reactor 10 is a passive element which can store energy in a magnetic field generated by an electric current which flows through the reactor 10.

The power source 20 is a DC power source which supplies an electric current to the reactor 10. The MOSFET 100 controls an electric current supplied from the power source 20 to the reactor 10. To be more specific, the MOSFET 100 is switched to assume an ON state in response to a clock signal applied from a drive circuit (not shown in the drawing) to a gate electrode of the MOSFET 100, and electrically interconnects the reactor 10 and a negative pole of the power source 20. The specific structure of the MOSFET 100 is described later.

The rectifier element 30 is a silicon fast recovery diode (Si-FRD) which performs a rectifying operation of an electric current supplied from the power source 20 to the reactor 10. To be more specific, the rectifier element 30 is a lifetime-controlled PIN diode.

A positive pole (+) of the power source 20 is electrically connected to one end 12 of the reactor 10 and a cathode electrode of the rectifier element 30, and a negative pole (−) of the power source 20 is electrically connected to a source electrode of the MOSFET 100. A drain electrode of the MOSFET 100 is electrically connected to the other end 14 of the reactor 10 and an anode electrode of the rectifier element 30.

In such a power conversion circuit 1, when the MOSFET 100 is in an ON state, an electric current path from a positive pole (+) of the power source 20 to the negative pole (−) of the power source 20 through the reactor 10 and the MOSFET 100 is formed, and an electric current flows through the electric current path (see FIG. 5A). In this case, electric energy of the power source 20 is stored in the reactor 10.

Figure 9A:
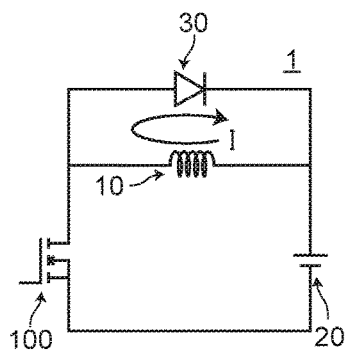
FIG. 9A to FIG. 9C are views showing operational states of the power conversion circuit 1, the MOSFET 100, and the rectifier element 30 when the MOSFET 100 is in an OFF state.

When the MOSFET 100 is turned off, an electric current which flows through the electric current path from the positive pole (+) of the power source 20 to the negative pole (−) of the power source 20 through the reactor 10 and the MOSFET 100 is decreased and soon becomes 0 (see FIG. 9A). On the other hand, the reactor 10 generates an electromotive force in a direction in which a change in an electric current is obstructed (electric energy stored in the reactor 10 is discharged) due to a self induction effect. An electric current generated due to an electromotive force of the reactor 10 flows to the rectifier element 30, and a forward electric current flows in the rectifier element 30 (see FIG. 9A).

A sum of an amount of an electric current which flows through the MOSFET 100 and an amount of an electric current which flows through the rectifier element 30 is equal to an amount of an electric current which flows through the reactor 10. A switching period of the MOSFET 100 is short (possibly 100 nanoseconds at maximum) and hence, an amount of an electric current which flows through the reactor 10 minimally changes during such a period. Accordingly, a sum of an amount of an electric current which flows through the MOSFET 100 and an amount of an electric current which flows through the rectifier element 30 minimally changes in either case, that is, an ON state, a turn-off period or an OFF state.

In such a power conversion circuit 1, assume a case where, as the MOSFET, a conventional MOSFET 900 or a MOSFET (a MOSFET according to a comparative example) where a total amount of a dopant in a p-type column region is set to a value greater than a total amount of a dopant in an n-type column region is used. In such a case, when the MOSFET is turned off, a drain current Id of the MOSFET is rapidly decreased and a drain-source voltage Vds is rapidly increased and hence, a surge voltage is increased (see Vds of the comparative example shown in FIG. 3).

Accordingly, in the present invention, as the MOSFET, the MOSFET 100 according to Embodiment 1 having the following structure is used.

2. Structure of MOSFET 100 According to Embodiment 1

Figure 2:
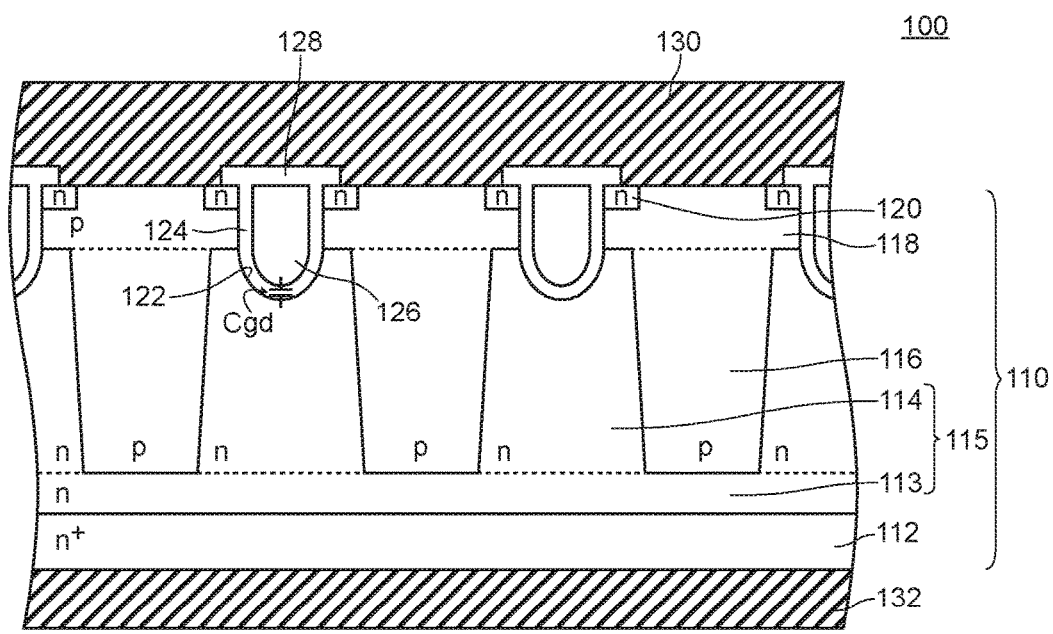
FIG. 2 is a cross-sectional view of a MOSFET 100 according to Embodiment 1.

As shown in FIG. 2, the MOSFET 100 according to Embodiment 1 is a trench-gate-type MOSFET which includes a semiconductor base substrate 110, a trench 122, a gate electrode 126, an interlayer insulation film 128, a source electrode 130, and a drain electrode 132. A drain-source withstand voltage of the MOSFET 100 is 300V or more, for example, 600V.

The semiconductor base substrate 110 has an n-type low-resistance semiconductor layer 112, an n-type buffer layer 113 formed on the low-resistance semiconductor layer 112 and having a lower dopant concentration than dopant concentration in the low-resistance semiconductor layer 112, n-type column regions 114 and p-type column regions 116 formed on the buffer layer 113 where the n-type column region 114 and the p-type column region 116 are alternately arranged along a horizontal direction, a p-type base region 118 formed on surfaces of the n-type column regions 114 and surfaces of the p-type column regions 116, and n-type source regions 120 formed on a surface of the base region 118, wherein the n-type column regions 114 and the p-type column regions 116 form a super junction structure. The buffer layer 113 and the n-type column regions 114 are integrally formed, and the buffer layer 113 and the n-type column regions 114 form an n-type semiconductor layer 115.

In the semiconductor base substrate 110, the n-type column region 114 and the p-type column region 116 are formed such that a total amount of a dopant in the n-type column region 114 is set to a value equal to a total amount of a dopant in the p-type column region 116. Accordingly, the total amount of a dopant in the p-type column region is set to a value equal to or smaller than 1.03 times as much as the total amount of a dopant in the n-type column region and hence, a bump waveform described later is generated on a waveform of a drain current.

In the p-type column region 116, in a depth direction of the p-type column region 116, a width of the p-type column region 116 is gradually increased as the p-type column region 116 extends from a deep portion of the p-type column region 116 toward a surface of the p-type column region 116. Dopant concentration in the p-type column region 116 is constant regardless of a depth of the p-type column region 116.

All of the n-type column regions 114, the p-type column regions 116, the source regions 120, the trenches 122 and the gate electrodes 126 are formed in a stripe shape as viewed in a plan view.

A thickness of the low-resistance semiconductor layer 112 falls in a range of 100 μm to 400 μm, for example, and dopant concentration in the low-resistance semiconductor layer 112 falls in a range of $1\times10^{19}$ cm$^{-3}$ to $1\times10^{20}$ cm$^{-3}$, for example. A thickness of the n-type semiconductor layer 115 falls in a range of 5 μm to 120 μm, for example. Dopant concentration in the n-type semiconductor layer 115 falls in a range of $5\times10^{13}$ cm$^{-3}$ to $1\times10^{16}$ cm$^{-3}$, for example. Dopant concentration in the p-type column region 116 falls in a range of $5\times10^{13}$ cm$^{-3}$ to $1\times10^{16}$ cm$^{-3}$, for example. A depth position of a deepest portion of the base region 118 falls in a range of 0.5 μm to 2.0 μm, for example, and dopant concentration in the base region 118 falls in a range of $5\times10^{16}$ cm$^{-3}$ to $1\times10^{18}$ cm$^{-3}$, for example. A depth position of a deepest portion of the source region 120 falls in a range of 0.1 μm to 0.4 μm, for example, and dopant concentration in the source region 120 falls in a range of $5\times10^{19}$ cm$^{-3}$ to $2\times10^{20}$ cm$^{-3}$, for example.

The trench 122 is formed in a region where the n-type column region 114 is positioned as viewed in a plan view such that the trench 122 reaches a depth position deeper than the deepest portion of the base region 118 and a portion of the source region 120 is exposed on an inner peripheral surface of the trench 122. A depth of the trench 122 is 3 μm, for example.

The gate electrode 126 is embedded in the inside of the trench 122 by way of a gate insulation film 124 formed on the inner peripheral surface of the trench 122. The gate insulation film 124 is formed of a silicon dioxide film formed by a thermal oxidation method and having a thickness of 100 nm, for example. The gate electrode 126 made of low-resistance polysilicon formed by a CVD method and an ion implantation method.

The interlayer insulation film 128 is formed so as to cover a portion of the source region 120, the gate insulation film 124 and the gate electrode 126. The interlayer insulation film 128 is formed of a PSG film formed by a CVD method and having a thickness of 1000 nm, for example.

The source electrode 130 is formed so as to cover the base region 118, portions of the source regions 120, and the interlayer insulation films 128. The source electrode 130 is electrically connected with the source region 120. The drain electrode 132 is formed on a surface of the low-resistance semiconductor layer 112. The source electrode 130 is made of aluminum-based metal (Al—Cu-based alloy, for example) formed by a sputtering method and having a thickness of 4 μm, for example. The drain electrode 132 is formed of a multi-layered metal film such as a Ti—Ni—Au film. A total thickness of the multi-layered metal film is 0.5 μm, for example.

3. Waveform and Operation of MOSFET 100 when MOSFET 100 is Turned Off

To describe the MOSFET 100 according to Embodiment 1, a MOSFET according to the comparative example is described first. The MOSFET according to the comparative example basically has the structure which is substantially equal to the configuration of the MOSFET 100 according to Embodiment 1. However, the MOSFET according to the comparative example differs from the MOSFET 100 according to Embodiment 1 with respect to a total amount of a dopant in an n-type column region and a total amount of a dopant in a p-type column region. That is, in the MOSFET according to the comparative example, a total amount of a dopant in the p-type column region is set to 1.10 times as much as a total amount of a dopant in the n-type column region.

Figure 3:
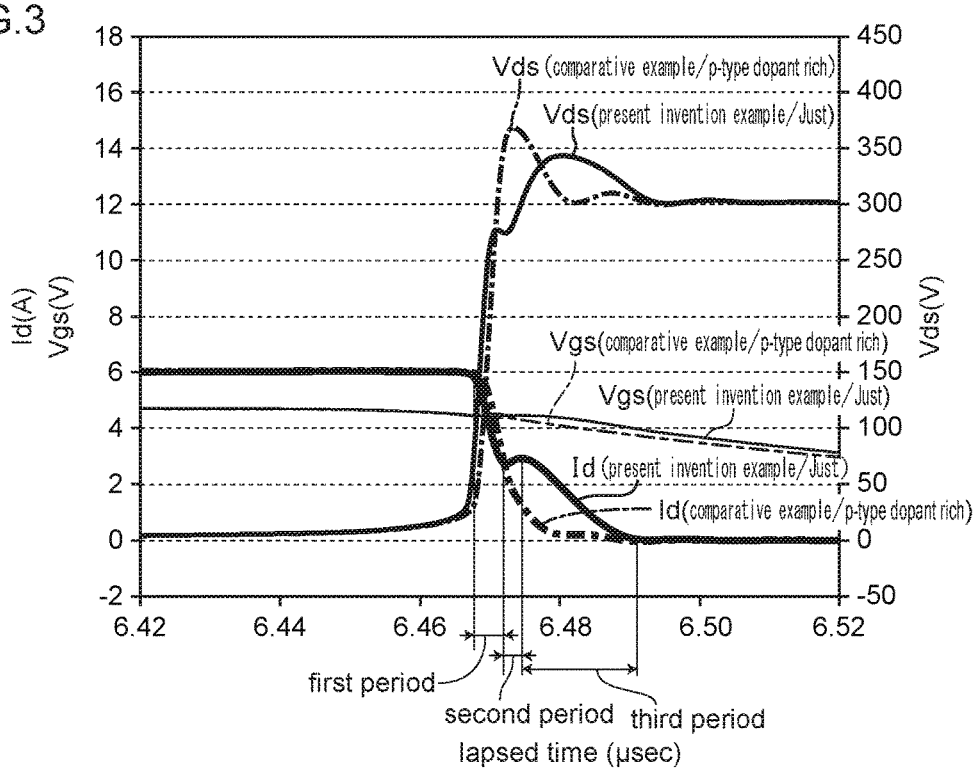
FIG. 3 is a graph showing a time transition simulation result of a drain current Id, a drain-source voltage Vds, and a gate-source voltage Vgs when a MOSFET is turned off. The MOSFET of the present invention example is the MOSFET 100 according to Embodiment 1, and the MOSFET of the comparative example is a MOSFET where a total amount of a dopant in a p-type column region is set to 1.10 times as much as a total amount of a dopant in an n-type column region. A power source voltage is set to 300V.

In the power conversion circuit 1 according to Embodiment 1, when the MOSFET according to the comparative example is used in place of the MOSFET 100, the MOSFET according to the comparative example is operated such that a drain current Id is rapidly decreased when the MOSFET is turned off (see a thick dot-dash line in FIG. 3). Further, the MOSFET according to the comparative example is operated such that a drain-source voltage Vds is rapidly increased and reaches approximately 370V within a short period and, thereafter, oscillates and becomes stable at a power source voltage (300V) (see a thin dot-dash line in FIG. 3). The MOSFET according to the comparative example is operated such that a gate-source voltage Vgs is monotonously decreased from approximately a point of time that a drain-source voltage Vds is rapidly increased (see an extremely thin dot-dash line in FIG. 3).

On the other hand, in the power conversion circuit 1 according to Embodiment 1 which uses the MOSFET 100 according to Embodiment 1, the MOSFET 100 is operated during a period from a point of time when a drain current Id starts to decrease to a point of time when the drain current Id becomes 0 for the first time, in response to turning off of the MOSFET such that a first period during which the drain current Id is decreased, a second period during which the drain current Id is increased, and a third period during which the drain current Id is decreased again occur in this order (see a thick solid line in FIG. 3). The MOSFET 100 is operated such that a gradient of a drain-source voltage Vds is decreased during the second period and, thereafter, the drain-source voltage Vds is gradually increased and reaches approximately 350V during the third period with a gradient smaller than a gradient during the first period, and the drain-source voltage Vds oscillates with amplitude smaller than amplitude of oscillation in the MOSFET according to the comparative example and becomes stable at a power source voltage (300V) (see a thin solid line in FIG. 3).

A decrease amount of a drain current Id per unit time during the third period is set to a value smaller than a decrease amount of a drain current Id per unit time during the first period (see FIG. 3).

Figure 4:
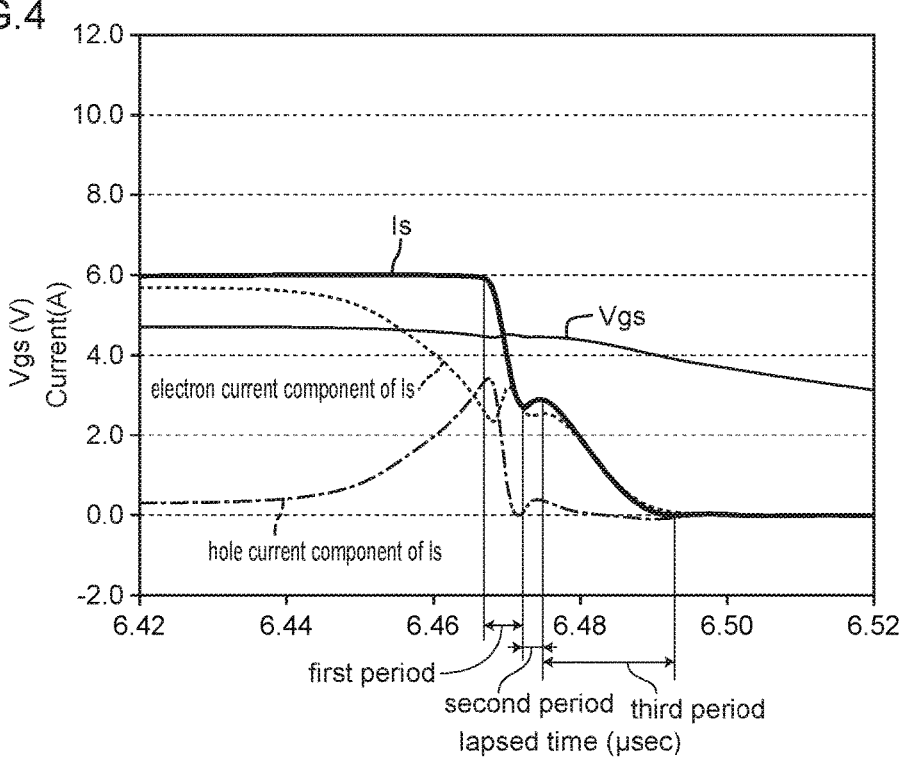
FIG. 4 is a graph showing a time transition simulation result of a source current Is, an electron current component and a hole current component of the source current Is, and a gate-source voltage Vgs when a MOSFET is turned off in a case where the MOSFET 100 according to Embodiment 1 is used as the MOSFET.

In the MOSFET 100, during the immediately before the first period, as shown in FIG. 4, an amount of electron current component in a total source current is decreased and, at the same time, an amount of hole current component in the total source current is increased (an amount of total source current being unchanged).

In the first period, am amount of hole current component is rapidly decreased and becomes substantially 0. On the other hand, although an amount of electron current component is temporarily increased, the amount of electron current component is decreased again. Accordingly, an amount of total source current is rapidly decreased by being largely affected by the decrease of the hole current component.

In the second period, an amount of electron current component is substantially leveled off (being constant or slightly increased). On the other hand, an amount of hole current component is temporarily increased. Accordingly, a total amount of source current as a sum is increased.

In the third period, an amount of hole current component which is temporarily increased is decreased at a relatively early stage and becomes 0. On the other hand, an amount of electron current component is monotonously decreased. Accordingly, a total amount of source current as a sum is also decreased along with the decrease of an amount of electron current component.

With respect to main currents which flow through the MOSFET, although an amount of drain current and an amount of source current are substantially equal, monitoring is performed using the drain current in general. A gate current is formed of a differential between the drain current and the source current and hence, the gate current is sufficiently small compared to the main currents in the MOSFET in general. On the other hand, monitoring is performed using a source current Is in FIG. 4. The reason is as follows. Although a drain current is formed of an electron current by 100%, a source current has property where only an electron current flows in an ON state, and both an electron current and a hole current flow and a sum of an amount of the electron current and an amount of the hole current becomes an amount of source current at the time of switching. Accordingly, when the confirmation of an operational state of the MOSFET is desirable, it is effective to monitor the content of the source current by simulation.

4. Operations of Power Conversion Circuit 1, MOSFET 100 and Rectifier Element 30

(1) ON State

When the MOSFET 100 is in an ON state, in the power conversion circuit 1, the electric current path from a positive pole (+) of the power source 20 to a negative pole (−) of the power source 20 through the reactor 10 and the MOSFET 100 is formed (see FIG. 5A). In this case, electric energy of the power source 20 is stored in the reactor 10.

In the MOSFET 100, a channel is formed in the base region 118 so as to electrically interconnect the drain electrode 132 and the source electrode 130 (see FIG. 5B).

In the rectifier element 30, an electric current does not flow in the rectifier element 30, and a depletion layer formed by a PN junction surface between a p-type region 32 of an anode electrode side and an n-type region 34 of a cathode electrode side expands (see FIG. 5C).

(2) Turn-Off Period

In the power conversion circuit 1, an electric current which flows through the electric current path from a positive pole (+) of the power source 20 to a negative pole (−) of the power source 20 through the reactor 10 and the MOSFET 100 is decreased (see FIG. 6A) and soon becomes 0. On the other hand, the reactor 10 generates an electromotive force for maintaining an electric current which flows through the reactor 10. The generated electromotive force changes a reverse bias applied to the rectifier element 30 to a forward bias so that a forward electric current flows in the rectifier element 30.

(2-1) First Period

In the MOSFET 100, a gate potential is largely decreased, and a channel formed in the base region 118 becomes narrow (see FIG. 6B). Accordingly, electrons hardly flow from the source electrode 130 into the semiconductor base substrate 110 so that an amount of a drain current Id is decreased.

In the rectifier element 30, a reverse bias is decreased so that carriers are moved toward the depletion layer which expands from the PN junction surface (holes going from the p-type region 32 toward the depletion layer and electrons going from the n-type region 34 toward the depletion layer). Accordingly, the depletion layer is gradually narrowed and, at the same time, a displacement current flows in the rectifier element 30 (see FIG. 6C).

During the first period, a drain potential is increased along with a lapse of time, and a potential (electrostatic potential) of the n-type column region 114 around the gate is also increased along with a lapse of time. Then, a decreased potential of the gate electrode 126 is increased via a gate-drain capacitance Cgd, and the channel is expanded so that a drain current Id is increased, and the MOSFET 100 is shifted to the second period.

(2-2) Second Period

In the power conversion circuit 1, an electric current which flows through the electric current path from the positive pole (+) of the power source 20 to the negative pole (−) of the power source 20 through the reactor 10 and the MOSFET 100 is temporarily increased. On the other hand, an electric current which flows from the reactor 10 to the rectifier element 30 is temporarily decreased (see FIG. 7A).

In the MOSFET 100, a potential of the gate electrode is increased and, eventually, a gate-source voltage Vgs is increased so that the channel of the base region 118 is temporarily expanded (see FIG. 7B). Accordingly, electrons flow from the source electrode 130 into the semiconductor base structure 110 so that an electric current which flows from the drain electrode 132 toward the source electrode 130 is temporarily increased.

In the rectifier element 30, the movement of holes which flow from the anode electrode into the depletion layer and contributes to the reduction of the depletion layer is temporarily stopped and, at the same time, the movement of electrons which flow from the cathode electrode into the depletion layer and contributes to the reduction of the depletion layer is temporarily stopped. Accordingly, a displacement current does not flow into the inside of the rectifier element 30 (into the inside of depletion layer) and hence, an amount of electric current which flows through the rectifier element 30 is decreased (see FIG. 7C).

(2-3) Third Period

Figure 8A:
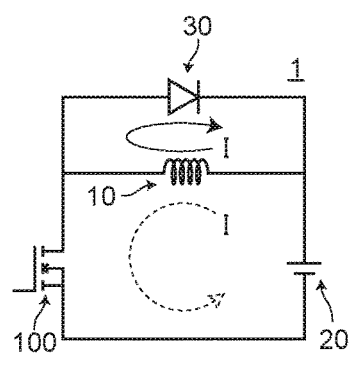
FIG. 8A to FIG. 8C are views showing operational states of the power conversion circuit 1, the MOSFET 100, and the rectifier element 30 during a third period.

In the power conversion circuit 1, an electric current which flows through the electric current path from the positive pole (+) of the power source 20 to the negative pole (−) of the power source 20 through the reactor 10 and the MOSFET 100 is decreased (see FIG. 8A). On the other hand, the reactor 10 generates an electromotive force for maintaining an electric current which flows through the reactor 10. The generated electromotive force decreases a reverse bias applied to the rectifier element 30.

Figure 8B:
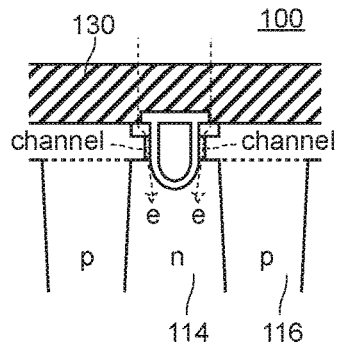

In the MOSFET 100, a gate-source voltage Vgs starts to decrease again and, in the same manner as the first period, a channel formed in the base region 118 is narrowed so that an electric current which flows between the drain electrode 132 and the source electrode 130 is decreased (see FIG. 8B). Then, when the gate-source voltage Vgs becomes smaller than a gate threshold value voltage, the channel disappears so that a drain current Id becomes 0 (OFF state).

Figure 8C:
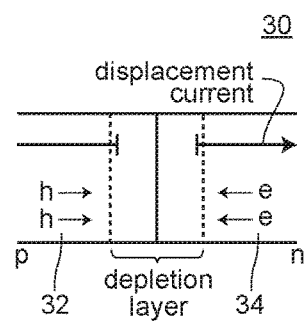

In the rectifier element 30, the depletion layer is narrowed again and, at the same time, a displacement current flows in the rectifier element 30 (see FIG. 8C).

(3) OFF State

In the power conversion circuit 1, an electric current which flows through the electric current path from the positive pole (+) of the power source 20 to the negative pole (−) of the power source 20 through the reactor 10 and the MOSFET 100 becomes 0 (see FIG. 9A). On the other hand, an electric current having the same current amount as an amount of electric current which flows in the MOSFET in an ON state flows in the rectifier element 30.

Figure 9B:
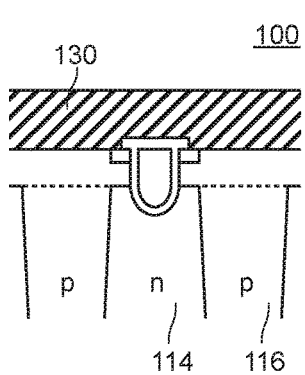

In the MOSFET 100, a gate-source voltage Vgs becomes smaller than a gate threshold voltage and hence, the channel disappears and a drain current Id becomes 0 (see FIG. 9B).

Figure 9C:
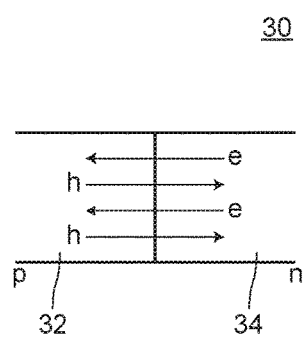

In the rectifier element 30, the depletion layer which expands from the PN junction surface disappears, and electrons and holes directly flow in the rectifier element 30 respectively (see FIG. 9C).

Even when a silicon-carbide Schottky barrier diode (SiC-SBD) is used as the rectifier element, an operation of the MOSFET 100 during a turn-off period is almost the same to the operation in the case where a silicon fast recovery diode (Si-FRD) is used as the rectifier element (the case of the power conversion circuit 1 according to the above-mentioned Embodiment 1), and the periods from the first period to the third period occur during the turn-off period.

The reason is as follows. That is, if a SiC-SBD is used as the rectifier element, when a reverse bias is applied, a depletion layer in a semiconductor is used as a dielectric, a capacitance is generated between a Schottky electrode and a portion of a semiconductor base substrate which is not depleted, and a Schottky junction portion has a junction capacitance (this junction capacitance is possibly equal to or greater than a corresponding junction capacitance in the case where an Si-FRD is used as the rectifier element). Accordingly, even when a SiC-SBD is used as the rectifier element, a displacement current flows due to a change in a bias voltage.

Accordingly, in the above-mentioned description of the operation of the power conversion circuit 1 where an Si-FRD is used as the rectifier element (the case of the power conversion circuit 1 according to the above-mentioned Embodiment 1), an operation mechanism where a SiC-SBD is used as the rectifier element is directly applicable, by replacing a capacitance of a PN junction with a capacitance of a Schottky junction, as an operation mechanism including a behavior of a displacement current. As a result, even when a SiC-SBD is used as the rectifier element, an operation of the MOSFET 100 during a turn-off period is almost the same to the operation in the case where a Si-FRD is used as the rectifier element (the case of the power conversion circuit according to the above-mentioned Embodiment 1), and the periods from the first period to the third period occur during the turn-off period.

5. Advantageous Effect Acquired by MOSFET 100 and Power Conversion Circuit 1 According to Embodiment 1

According to the MOSFET 100 and the power conversion circuit 1 of Embodiment 1, a total amount of a dopant in the p-type column region is set to a value equal to a total amount of a dopant in the n-type column region 114 (Just), and the MOSFET 100 is configured to be operated during a period from a point of time when a drain current Id starts to decrease to a point of time when the drain current Id becomes 0 for the first time in response to turning off of the MOSFET 100 such that a first period during which the drain current Id is decreased, a second period during which the drain current Id is increased, and a third period during which the drain current Id is decreased again occur in this order. With such an operation, a time until a current value of a drain current Id becomes 0 can be extended compared with the conventional MOSFET 900 and, at the same time, a decrease amount of the drain current Id per unit time during the third period can be made relatively small. Accordingly, a surge voltage of the MOSFET 100 can be made relatively small and hence, the MOSFET 100 according to Embodiment 1 can easily satisfy a standard for a surge voltage which the power conversion circuit is required to possess. As a result, the MOSFET 100 and the power conversion circuit 1 according to Embodiment 1 are applicable to various power conversion circuits.

Further, since the MOSFET 100 and the power conversion circuit 1 according to Embodiment 1 are configured as described above, compared with the conventional MOSFET 900, a time until a drain-source voltage Vds becomes maximum can be extended and, at the same time, an increase amount per unit time of the drain-source voltage Vds until the drain-source voltage Vds becomes maximum can be made small and hence, oscillation minimally occurs compared with the conventional MOSFET 900. Accordingly, it is unnecessary to incorporate a constitutional element such as a noise filter in the power conversion circuit for suppressing oscillation.

The oscillation in the circuit is a phenomenon where, when a surge voltage is high, an electric current and a voltage cause waving (ringing) after an electric current becomes 0 for the first time. Accordingly, the increase and the decrease of an electric current from the first period to the third period in the present invention, do not constitute the oscillation.

According to the MOSFET 100 and the power conversion circuit 1 of the embodiment 1, a total amount of a dopant in the p-type column region 116 is set to a value which is 1.00 time as much as a total amount of a dopant in the n-type column region 114. Accordingly, a bump waveform does not become excessively large and hence, when the MOSFET 100 is turned off, a time necessary for turning off the MOSFET 100 can be shortened so that a turn-off loss can be reduced.

The MOSFET 100 according to the embodiment 1 includes the semiconductor base substrate 110 where the super junction structure is formed of the n-type column regions 114 and the p-type column regions 116 and hence, it is possible to provide a switching element having a low ON resistance and a high withstand voltage in the same manner as the conventional MOSFET 900.

According to the MOSFET 100 of Embodiment 1, a decrease amount of a drain current Id per unit time during the third period is set to a value smaller than a decrease amount of a drain current Id per unit time during the first period and hence, a surge voltage of the MOSFET 100 can be made even smaller when the MOSFET 100 is turned off. As a result, the MOSFET 100 according to Embodiment 1 can easily satisfy a standard for a surge voltage which the power conversion circuit is required to possess with more certainty and hence, the MOSFET 100 according to Embodiment 1 is applicable to further various power conversion circuits.

According to the MOSFET 100 of Embodiment 1, the MOSFET 100 is a trench-gate-type MOSFET which includes: the trench 122 which is formed so as to reach a depth position deeper than a deepest portion of the base region 118 in a region where the n-type column region 114 is positioned as viewed in a plan view; and the gate electrode 126 embedded in the inside of the trench 122 by way of the gate insulation film 124 formed on the inner peripheral surface of the trench 122. Accordingly, (1) at a lower portion of the gate electrode 126, a side surface side and a bottom portion side of the gate electrode 126 are surrounded by the n-type column region 114 and hence, when the MOSFET 100 is turned off and a potential of the n-type column region 114 is increased, a gate potential is easily increased via a gate-drain capacitance Cgd. Further, (2) compared with a case of a planar-gate-type MOSFET, the gate electrode and the drain electrode are disposed close to each other and hence, a potential of the n-type column region 114 around the gate is easily increased. Accordingly, a surge voltage of the MOSFET 100 can be made even smaller. As a result, the MOSFET 100 of Embodiment 1 can more easily satisfy a standard for a surge voltage which the power conversion circuit 1 is required to possess so that the MOSFET 100 of Embodiment 1 is applicable to further various power conversion circuits.

According to the MOSFET 100 of Embodiment 1, in the p-type column region 116, in a depth direction of the p-type column region 116, a width of the p-type column region 116 is increased as the p-type column region 116 extends from a deep portion of the p-type column region 116 toward a surface of the p-type column region 116 and hence, when the MOSFET is turned off, holes around the gate can be easily extracted. As a result, an L-load avalanche breakdown resistance can be increased.

According to the power conversion circuit 1 of Embodiment 1, the rectifier element 30 is a fast recovery diode and hence, when the MOSFET 100 is turned on, a loss caused by a reverse recovery current can be reduced.

[Modifications]

Figure 10:
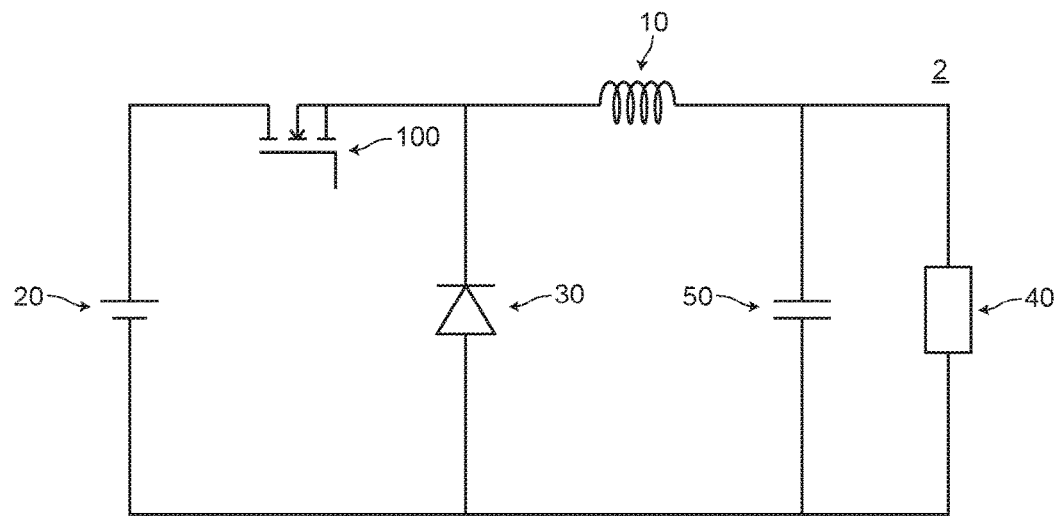
FIG. 10 is a circuit diagram showing a power conversion circuit 2 according to Modification 1.
Figure 11:
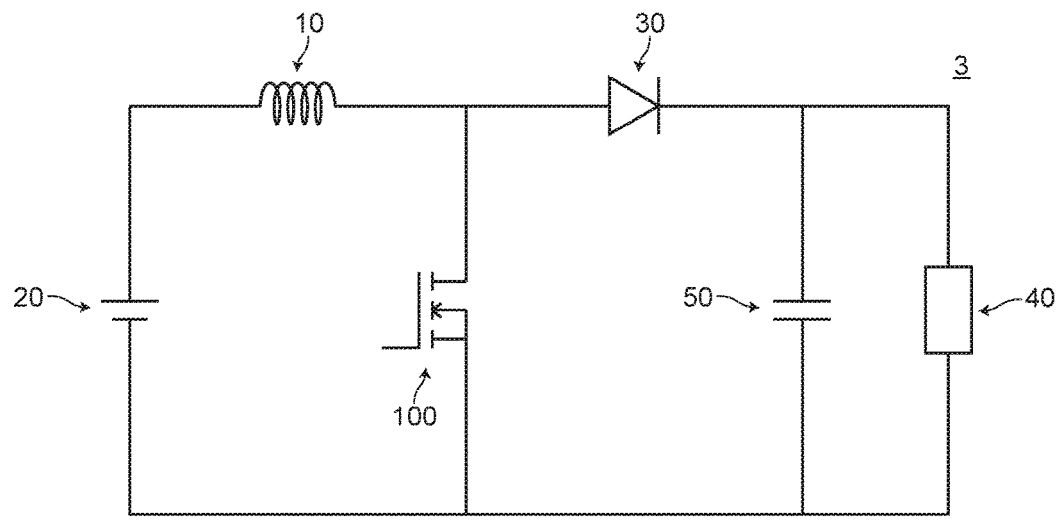
FIG. 11 is a circuit diagram showing a power conversion circuit 3 according to Modification 2.

A power conversion circuit 2 according to Modification 1 and a power conversion circuit 3 according to Modification 2 basically have the configurations substantially equal to the configuration of the power conversion circuit 1 according to Embodiment 1. However, the power conversion circuit 2 according to Modification 1 and the power conversion circuit 3 according to Modification 2 differ from the power conversion circuit 1 according to Embodiment 1 with respect to positional relationships of the respective constitutional elements. That is, the power conversion circuit 2 according to Modification 1 is a step-down chopper circuit as shown in FIG. 10, and the power conversion circuit 3 according to Modification 2 is a step-up chopper circuit as shown in FIG. 11.

In this manner, the power conversion circuit 2 according to Modification 1 and the power conversion circuit 3 according to Modification 2 differ from the power conversion circuit 1 according to Embodiment 1 with respect to the positional relationships of the respective constitutional elements. However, in the same manner as the power conversion circuit 1 according to Embodiment 1, a total amount of a dopant in the p-type column region 116 is set to a value equal to a total amount of a dopant in the n-type column region 114, and the MOSFET 100 is configured to be operated during a period from a point of time when a drain current Id starts to decrease to a point of time when the drain current Id becomes 0 for the first time in response to turning off of the MOSFET 100 such that a first period during which the drain current Id is decreased, a second period during which the drain current Id is increased, and a third period during which the drain current Id is decreased again occur in this order. With such an operation, a time until a current value of a drain current Id becomes 0 can be extended compared with the conventional MOSFET 900 and, at the same time, a decrease amount of the drain current Id per unit time during the third period can be made relatively small. Accordingly, a surge voltage of the MOSFET 100 can be made relatively small and hence, the MOSFETs 100 according to Modification 1 and Modification 2 can easily satisfy a standard for a surge voltage which the power conversion circuit is required to possess. As a result, the MOSFETs and the power conversion circuits according to Modification 1 and Modification 2 are applicable to various power conversion circuits.

Embodiment 2

Figure 12:
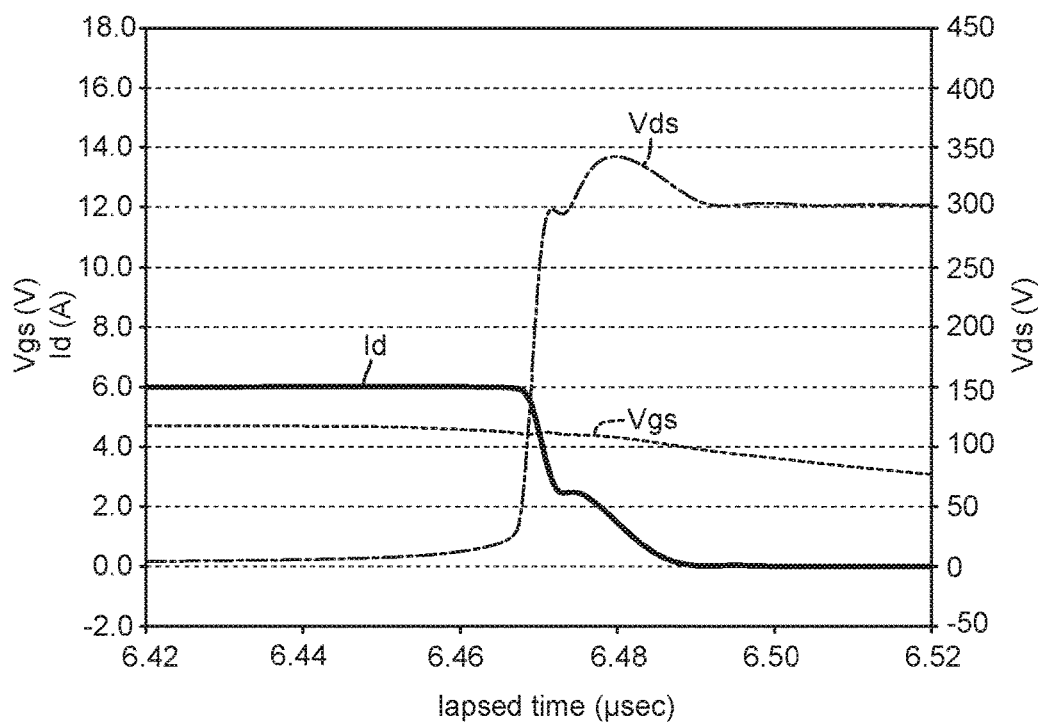
FIG. 12 is a graph showing a time transition simulation result of a drain current Id, a drain-source voltage Vds, and a gate-source voltage Vgs when a MOSFET is turned off in a case where the MOSFET according to Embodiment 2 is used as the MOSFET. The MOSFET according to Embodiment 2 is a MOSFET where a total amount of a dopant in a p-type column region is set to 1.02 times as much as a total amount of a dopant in an n-type column region.

A MOSFET according to Embodiment 2 basically has the configuration substantially equal to the configuration of the MOSFET 100 according to Embodiment 1. However, the MOSFET according to Embodiment 2 differs from the MOSFET 100 according to Embodiment 1 with respect to a point where a total amount of a dopant in the p-type column region is set to a value greater than a total amount of a dopant in the n-type column region. Also in this case, as shown in FIG. 12, the MOSFET is configured to be operated during a period from a point of time when a drain current Id starts to decrease to a point of time when the drain current Id becomes 0 for the first time in response to turning off of the MOSFET such that a first period during which the drain current Id is decreased, a second period during which the drain current Id is increased (or the drain current becomes constant), and a third period during which the drain current Id is decreased again occur in this order.

In the MOSFET according to Embodiment 2, a total amount of a dopant in the p-type column region is set to a value from greater than 1.00 up to and including 1.03 times as much as a total amount of a dopant in the n-type column region. With such a configuration, a bump waveform is generated on a waveform of the drain current.

Figure 13A:
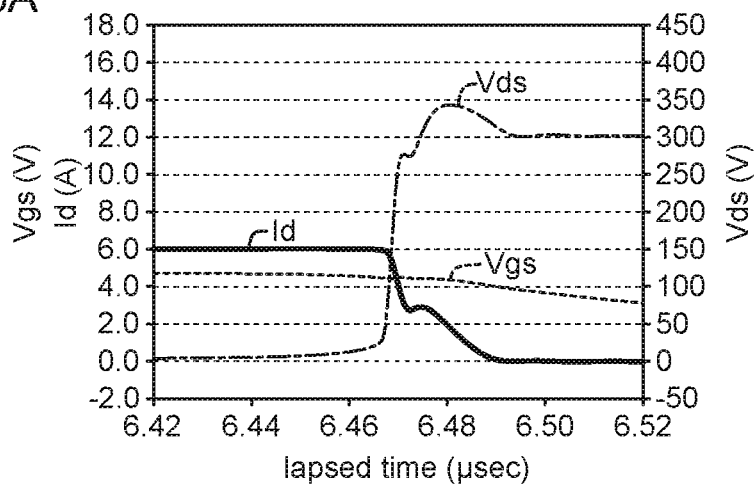
FIG. 13A to FIG. 13C are graphs showing time transition simulation results of a drain current Id, a drain-source voltage Vds, and a gate-source voltage Vgs in a trench-gate-type MOSFET when the MOSFET is turned off in a case where a total amount of a dopant in a p-type column region is equal to a total amount of a dopant in an n-type column region (Just), in a case where the total amount of the dopant in the p-type column region is set to 1.01 times as much as the total amount of the dopant in the n-type column region (1% p-type dopant rich), and in a case where the total amount of the dopant in the p-type column region is set to 1.02 times as much as the total amount of the dopant in the n-type column region (2% p-type dopant rich) respectively. That is.
Figure 13B:
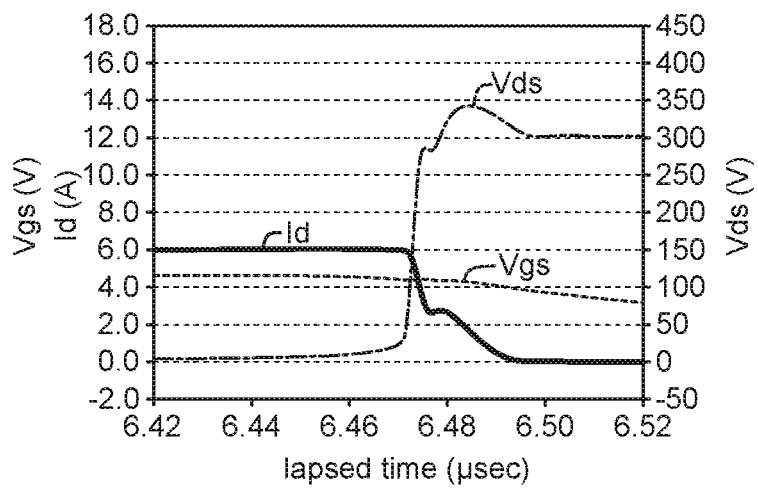
Figure 13C:
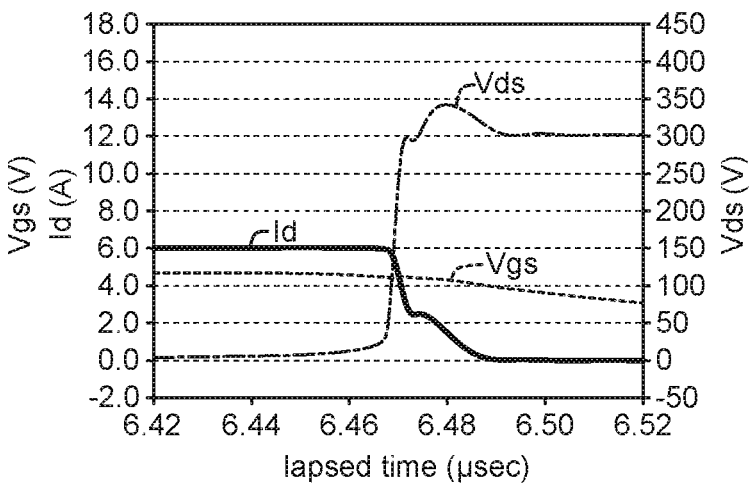
Figure 14A:
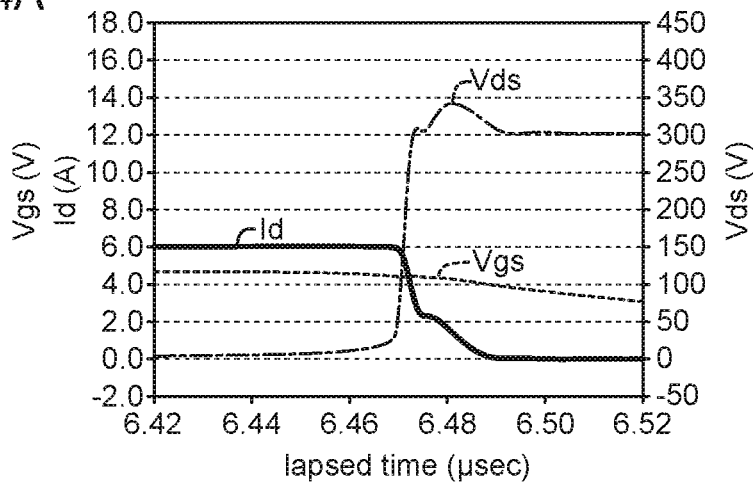
FIG. 14A to FIG. 14C are graphs showing time transition simulation results of a drain current Id, a drain-source voltage Vds and a gate-source voltage Vgs in a trench-gate-type MOSFET when the MOSFET is turned off in a case where a total amount of a dopant in a p-type column region is set to 1.03 times as much as a total amount of a dopant in an n-type column region (3% p-type dopant rich), in a case where the total amount of the dopant in the p-type column region is set to 1.04 times as much as the total amount of the dopant in the n-type column region (4% p-type dopant rich), and in a case where the total amount of the dopant in the p-type column region is set to 1.05 times as much as the total amount of the dopant in the n-type column region (5% p-type dopant rich) respectively. That is.
Figure 14B:
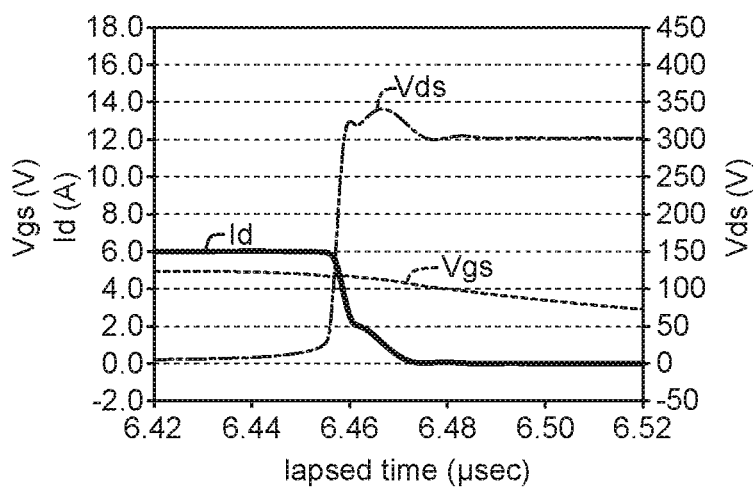
Figure 14C:
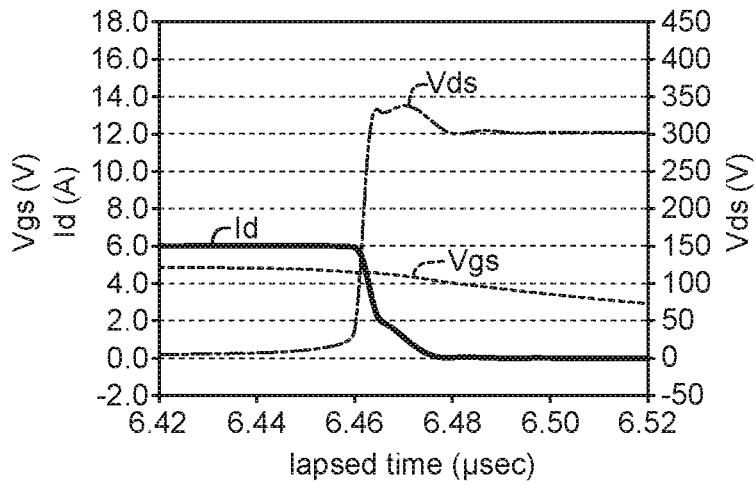

The reason a total amount of a dopant in the p-type column region is set to a value equal to or smaller than 1.03 times as much as a total amount of a dopant in the n-type column region is as follows. That is, as shown in FIG. 13 and FIG. 14, when a total amount of a dopant in the p-type column region is set to a value equal to a total amount of a dopant in the n-type column region or when a total amount of a dopant in the p-type column region is set to a value equal to or smaller than 1.03 times as much as a total amount of a dopant in the n-type column region, a bump waveform is generated on a waveform of a drain current (a second period during which the drain current is increased or the drain current is constant occurs, see FIG. 13A, FIG. 13B, FIG. 13C, and FIG. 14A), while when a total amount of a dopant in the p-type column region exceeds 1.03 times as much as a total amount of a dopant in the n-type column region, a bump waveform is not generated on a waveform of the drain current (the drain current being monotonously decreased although a gradient is gentle, see FIG. 14B and FIG. 14C). Accordingly, it is difficult to make a surge voltage of the MOSFET smaller than a surge voltage of a conventional MOSFET.

In this manner, the MOSFET according to Embodiment 2 differs from the MOSFET 100 according to Embodiment 1 with respect to a point where a total amount of a dopant in the p-type column region is set to a value greater than a total amount of a dopant in the n-type column region. However, a total amount of a dopant in the p-type column region is set to a value equal to or smaller than 1.03 times as much as a total amount of a dopant in the n-type column region. With such a configuration, in the same manner as the MOSFET 100 according to Embodiment 1, the MOSFET is configured to be operated during a period from a point of time when a drain current Id starts to decrease to a point of time when the drain current Id becomes 0 for the first time in response to turning off of the MOSFET such that a first period during which the drain current Id is decreased, a second period during which the drain current Id is increased (or the drain current becomes constant), and a third period during which the drain current Id is decreased again occur in this order. Accordingly, a time until a current value of a drain current Id becomes 0 can be extended compared with the conventional MOSFET 900 and, at the same time, a decrease amount of the drain current Id per unit time during the third period can be made relatively small. Accordingly, a surge voltage of the MOSFET of Embodiment 2 can be made relatively small and hence, the MOSFET according to Embodiment 2 can easily satisfy a standard for a surge voltage which the power conversion circuit is required to possess. As a result, the MOSFET according to Embodiment 2 is applicable to various power conversion circuits.

According to the MOSFET of Embodiment 2, a total amount of a dopant in the p-type column region is set to a value greater than a total amount of a dopant in the n-type column region. Accordingly, when the MOSFET is turned off, (1) the n-type column region is easily depleted so that the time until the MOSFET is turned off can be shortened whereby a turn-off loss can be reduced, and (2) holes in the n-type column region can be easily extracted so that the avalanche breakdown minimally occurs.

The MOSFET according to Embodiment 2 has the configuration substantially equal to the configuration of the MOSFET 100 according to Embodiment 1 with respect to points other than the point where a total amount of a dopant in the p-type column region is set to a value greater than a total amount of a dopant in the n-type column region. Accordingly, the MOSFET according to Embodiment 2 acquires advantageous effects corresponding to the advantageous effects which the MOSFET 100 according to Embodiment 1 possesses among all advantageous effects which the MOSFET 100 according to Embodiment 1 possesses.

Embodiment 3

Figure 15:
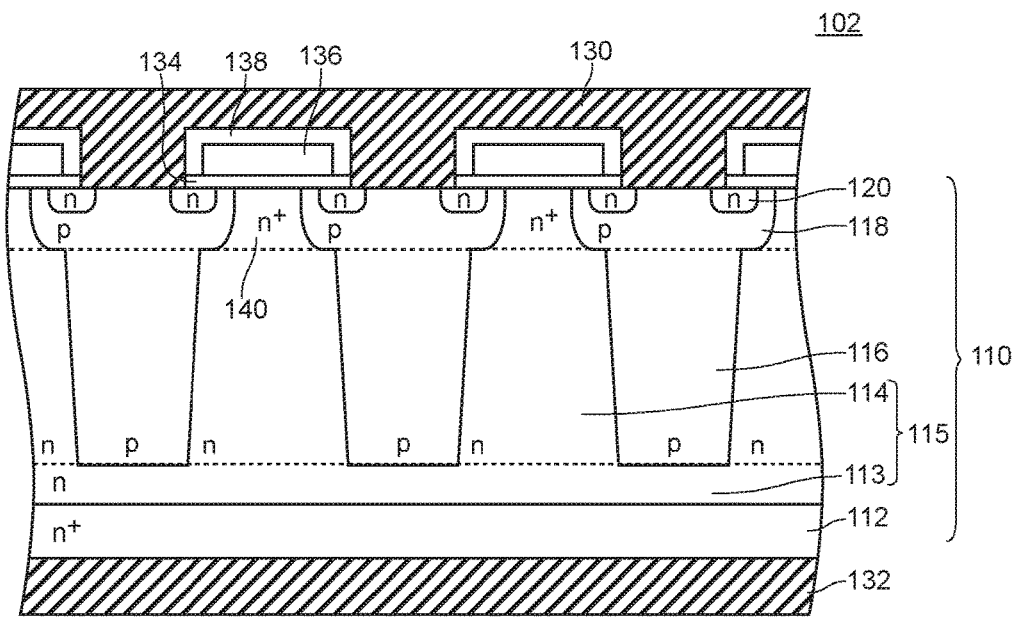
FIG. 15 is a cross-sectional view of a MOSFET 102 according to Embodiment 3.
Figure 16:
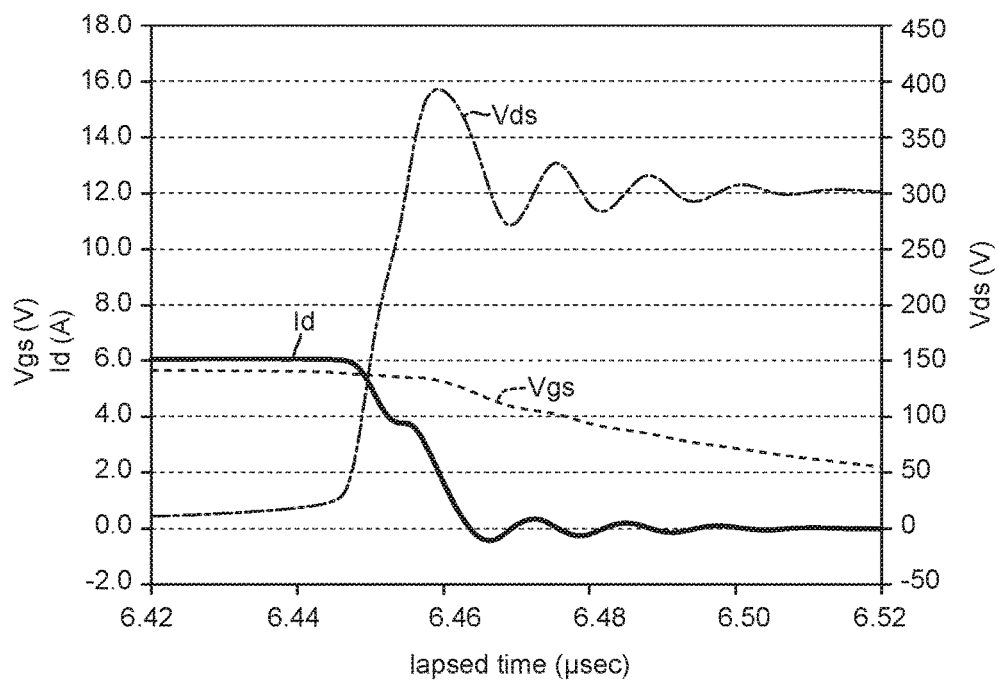
FIG. 16 is a graph showing a time transition simulation result of a drain current Id, a drain-source voltage Vds, and a gate-source voltage Vgs when a MOSFET is turned off in a case where the MOSFET according to Embodiment 3 is used as the MOSFET. The MOSFET according to Embodiment 3 is a MOSFET where a total amount of a dopant in a p-type column region is set to 1.02 times as much as a total amount of a dopant in an n-type column region.
Figure 17A:
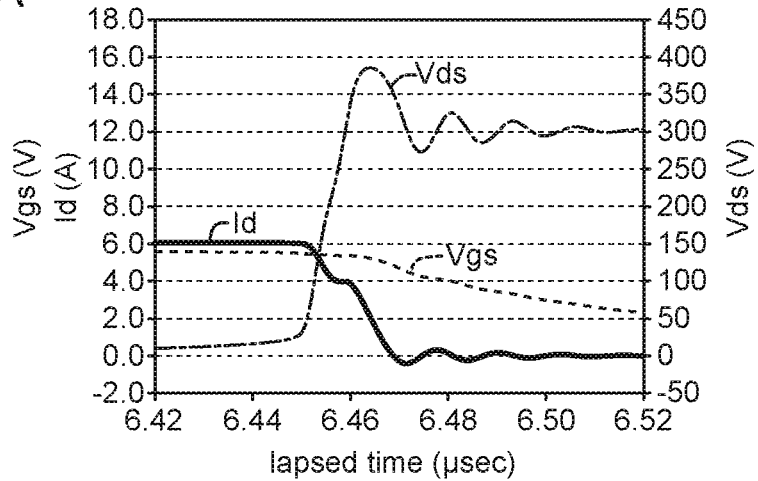
FIG. 17A to FIG. 17C are graphs showing time transition simulation results of a drain current Id, a drain-source voltage Vds, and a gate-source voltage Vgs in a planar-gate-type MOSFET when the MOSFET is turned off in a case where a total amount of a dopant in a p-type column region is equal to a total amount of a dopant in an n-type column region (Just), in a case where the total amount of the dopant in the p-type column region is set to 1.01 times as much as the total amount of the dopant in the n-type column region (1% p-type dopant rich), and in a case where the total amount of the dopant in the p-type column region is set to 1.02 times as much as the total amount of the dopant in the n-type column region (2% p-type dopant rich) respectively. That is.
Figure 17B:
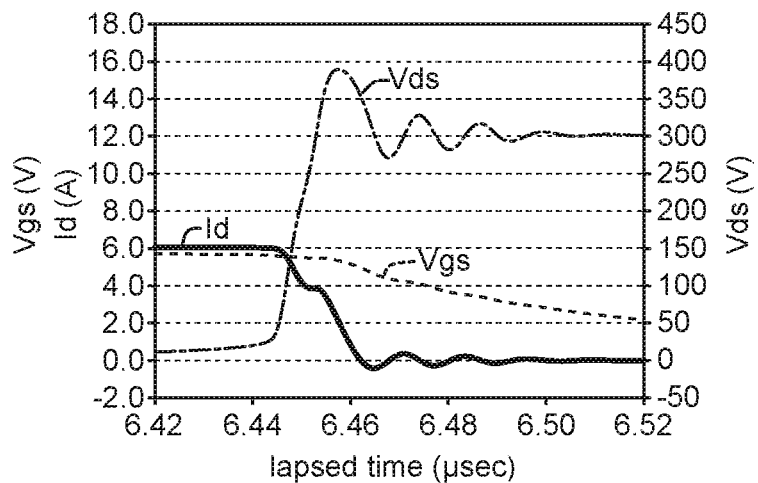
Figure 17C:
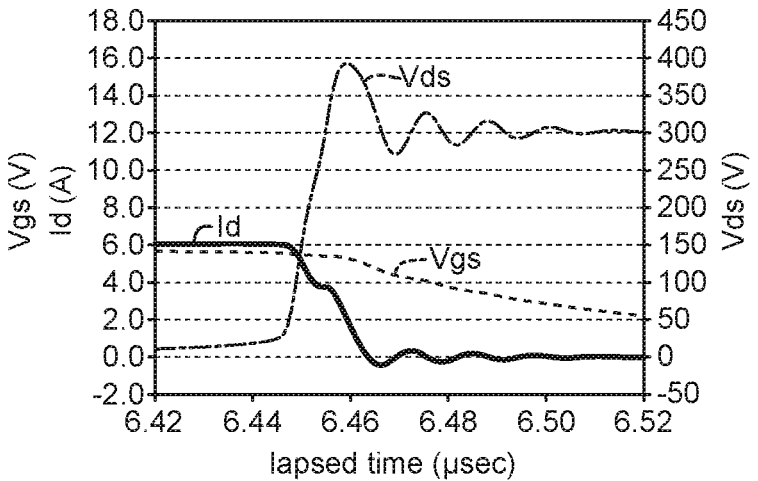

A MOSFET 102 according to Embodiment 3 basically has the configuration substantially equal to the configuration of the MOSFET 100 according to Embodiment 1 or 2. However, the MOSFET 102 according to Embodiment 3 differs from the MOSFET 100 according to Embodiment 1 or 2 with respect to a point where the MOSFET 102 according to Embodiment 3 is not a trench-gate-type MOSFET but is a planar-gate-type MOSFET. That is, in the MOSFET 102 according to Embodiment 3, as shown in FIG. 15, the semiconductor base substrate 110 further includes: a p-type base region 118 formed on surfaces of portions of n-type column regions 114 and whole surfaces of p-type column regions 116; and n-type source regions 120 formed on a surface of the base region 118, and the MOSFET 102 according to Embodiment 3 is a planar-gate-type MOSFET which further includes agate electrode 136 which is formed on the base region 118 sandwiched between the source region 120 and the n-type column region 114 (n-type surface high concentration diffusion region 140 described later) by way of a gate insulation film 134.

In the MOSFET 102 according to Embodiment 3, the semiconductor base substrate 110 further includes n-type surface high concentration diffusion regions 140 each of which is formed on a portion of the surface of the n-type column region 114 where the base region 118 is not formed. Dopant concentration in the surface high concentration diffusion region 140 is set to a value greater than dopant concentration in the n-type column region 114.

In the MOSFET 102 according to Embodiment 3, a total amount of a dopant in the p-type column region is set to a value which falls within a range of 1.00 to 1.03 times as much as a total amount of a dopant in the n-type column region (Just or slightly p-type dopant rich). Accordingly, a bump waveform is generated on the waveform of the drain current.

Figure 18A:
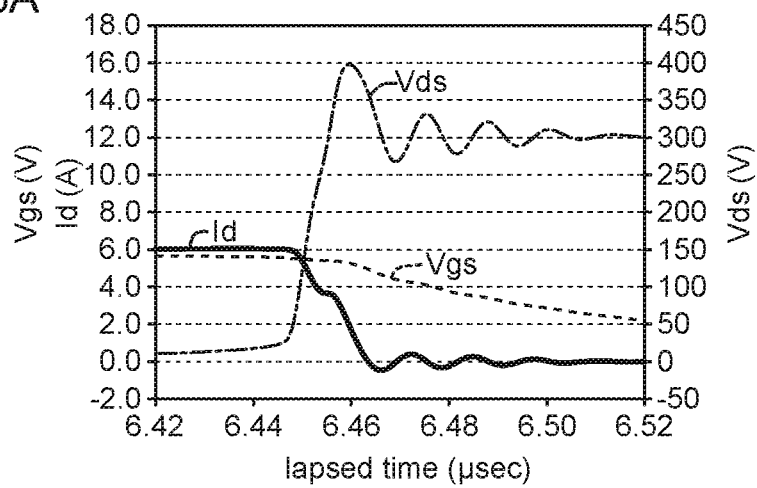
FIG. 18A to FIG. 18C are graphs showing time transition simulation results of a drain current Id, a drain-source voltage Vds, and a gate-source voltage Vgs in a planar-gate-type MOSFET when the MOSFET is turned off in a case where a total amount of a dopant in a p-type column region is set to 1.03 times as much as a total amount of a dopant in an n-type column region (3% p-type dopant rich), in a case where the total amount of the dopant in the p-type column region is set to 1.04 times as much as the total amount of the dopant in the n-type column region (4% p-type dopant rich), and in a case where the total amount of the dopant in the p-type column region is set to 1.05 times as much as the total amount of the dopant in the n-type column region (5% p-type dopant rich) respectively. That is.
Figure 18B:
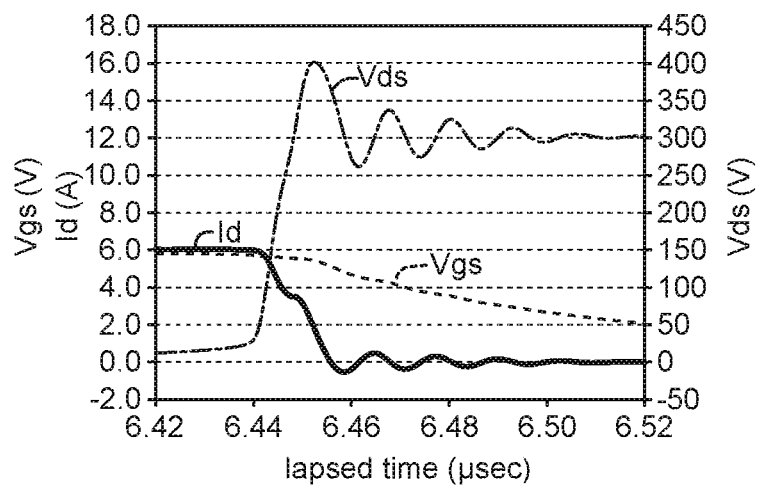
Figure 18C:
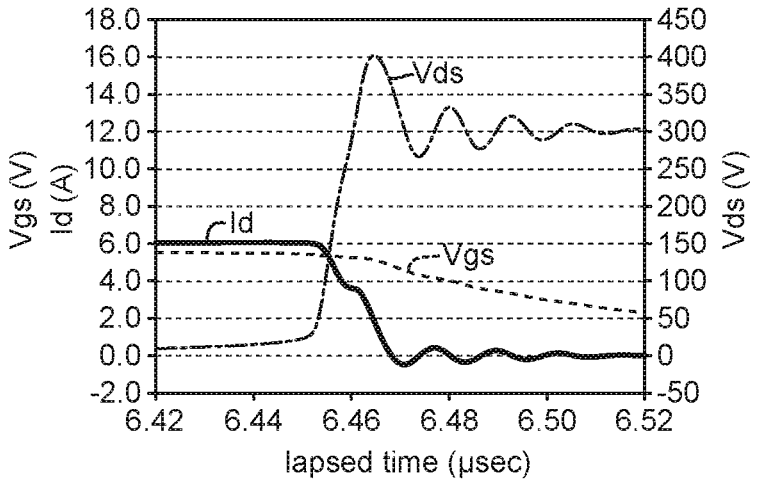

Also in the MOSFET 102 according to Embodiment 3 which is a planar-gate-type MOSFET, as shown in FIG. 17A to FIG. 18C, when a total amount of a dopant in the p-type column region is set to a value equal to a total amount of a dopant in the n-type column region or when a total amount of a dopant in the p-type column region is set to a value equal to or smaller than 1.03 times as much as a total amount of a dopant in the n-type column region, although a bump waveform is generated on a drain current (a second period where the drain current is constant (or is increased) occurs, see FIG. 17A, FIG. 17B, FIG. 17C and FIG. 18A), when a total amount of a dopant in the p-type column region is exceeds a value which is 1.03 times as large as a total amount of a dopant in the n-type column region, a bump waveform is not generated on a drain current (the drain current is gradually decreased so that the drain current is monotonously decreased even during a period corresponding to the second period, see FIG. 18B, FIG. 18C). Accordingly, it is difficult to set a surge voltage of the MOSFET smaller than a surge voltage of a conventional MOSFET. From this point of view, it is more preferable that a total amount of a dopant in a p-type column region be set to a value which falls within a range of 1.00 to 1.02 times as much as a total amount of a dopant in an n-type column region where a bump waveform is more likely to be generated on a drain current.

As described above, the MOSFET 102 according to Embodiment 3 differs from the MOSFET according to Embodiment 1 or 2 with respect to the point where the MOSFET 102 according to Embodiment 3 is not a trench-gate-type MOSFET but is a planar-gate-type MOSFET. However, a total amount of a dopant in the p-type column region is set to a value equal to or smaller than 1.03 times (a value which falls within a range of 1.00 to 1.03 times) as much as a total amount of a dopant in the n-type column region and, in the same manner as the MOSFET according to Embodiment 1 or 2, the MOSFET is configured to be operated during a period from a point of time when a drain current Id starts to decrease to a point of time when the drain current Id becomes 0 for the first time in response to turning off of the MOSFET 100 such that a first period during which the drain current Id is decreased, a second period during which the drain current Id is increased or the drain current Id becomes constant, and a third period during which the drain current Id is decreased again occur in this order. Accordingly, compared with the conventional MOSFET 900, a time until a current value of a drain current Id becomes 0 can be extended and, at the same time, a decrease amount of a drain current Id per unit time during the third period can be made relatively small. Accordingly, a surge voltage of the MOSFET can be made relatively small and hence, the MOSFET 102 according to Embodiment 3 can easily satisfy a standard for a surge voltage which the power conversion circuit is required to possess. As a result, the MOSFET 102 according to Embodiment 3 is applicable to various power conversion circuits.

According to the MOSFET 102 of Embodiment 3, the semiconductor base substrate 110 has the n-type surface high concentration diffusion region 140 which is formed on a portion of the surface of the n-type column region 114 where the base region 118 is not formed and hence, when the MOSFET is turned off, the surface high concentration diffusion region 140 is minimally depleted whereby along with the increase of a drain potential, a potential of the n-type column region 114 around the gate is easily increased. Accordingly, a potential of the gate electrode 136 is easily increased via a gate-drain capacitance Cgd. As a result, the second period during which a drain current Id is increased or the drain current becomes constant easily occurs during a period from a point of time when the drain current Id starts to decrease to a point of time when the drain current Id becomes 0 for the first time.

The MOSFET 102 according to Embodiment 3 has the configuration substantially equal to the configuration of the MOSFET according to Embodiment 1 or 2 with respect to points other than the point where the MOSFET 102 according to Embodiment 3 is not a trench-gate-type MOSFET but is a planar-gate-type MOSFET and hence, the MOSFET 102 according to Embodiment 3 acquires advantageous effects corresponding to the advantageous effects which the MOSFET according to Embodiment 1 or 2 possesses among all advantageous effects which the MOSFET according to Embodiment 1 or 2 possesses.

Embodiment 4

Figure 19:
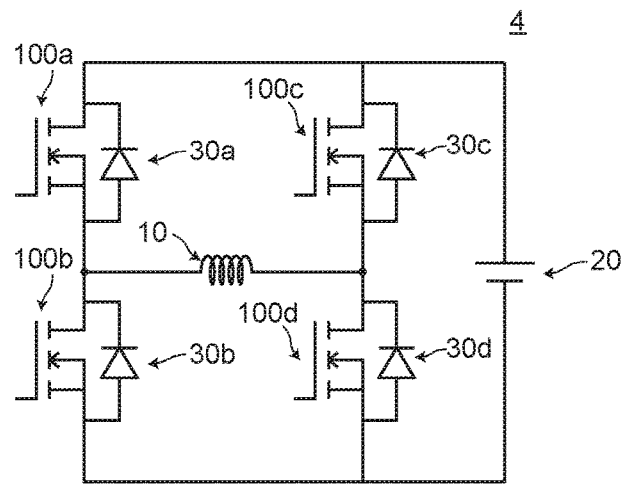
FIG. 19 is a circuit diagram showing a power conversion circuit 4 according to Embodiment 4.

A power conversion circuit 4 according to Embodiment 4 basically has the configuration substantially equal to the configuration of the power conversion circuits according to Embodiments 1 to 3. However, the power conversion circuit 4 according to Embodiment 4 differs from the power conversion circuits according to Embodiments 1 to 3 (power conversion circuits which use the MOSFET according to any one of the embodiments 1 to 3) with respect to a point where the power conversion circuit is a full bridge circuit. That is, as shown in FIG. 19, the power conversion circuit 4 according to Embodiment 4 includes four MOSFETs 100 as the MOSFET, and also includes built-in diodes of the respective MOSFETs as rectifier elements.

As described above, the power conversion circuit 4 according to Embodiment 4 differs from the power conversion circuits according to Embodiments 1 to 3 with respect to the point where the power conversion circuit is a full bridge circuit. However, a total amount of a dopant in the p-type column region of the MOSFET is set to a value equal to or smaller than 1.03 times as much as a total amount of a dopant in the n-type column region, and the MOSFET is configured to be operated during a period from a point of time when a drain current Id starts to decrease to a point of time when the drain current Id becomes 0 for the first time in response to turning off of the MOSFET such that a first period during which the drain current Id is decreased, a second period during which the drain current Id is increased (or the drain current becomes constant), and a third period during which the drain current Id is decreased again occur in this order. Accordingly, compared with the conventional MOSFET 900, a time until a current value of a drain current Id becomes 0 can be extended and, at the same time, a decrease amount of a drain current Id per unit time during the third period can be made relatively small. Accordingly, a surge voltage of the MOSFET can be made relatively small and hence, the power conversion circuit 4 according to Embodiment 4 can easily satisfy a standard for a surge voltage which the power conversion circuit is required to possess. As a result, the power conversion circuit 4 according to Embodiment 4 is applicable to various power conversion circuits.

Further, according to the power conversion circuit 4 of Embodiment 4, the rectifier element is the built-in diode of the MOSFET and hence, it is unnecessary to prepare a rectifier element as an additional part.

The power conversion circuit 4 according to Embodiment 5 has the configuration substantially equal to the configurations of the power conversion circuits according to Embodiments 1 to 3 with respect to points other than the point where the power conversion circuit is a full bridge circuit. Accordingly, the power conversion circuit 4 according to Embodiment 4 acquires advantageous effects corresponding to the advantageous effects which the power conversion circuits according to Embodiments 1 to 3, among advantageous effects which the power conversion circuits according to Embodiments 1 to 3 possess.

In a full bridge circuit, there may be a case where a phenomenon referred to as "false turn-on" occurs whereby a circuit loss is increased. This operation mechanism is described hereinafter.

In FIG. 19, assume a state where both a MOSFET 100a and a MOSFET 100b are in OFF states, and an electric current flows through a reactor 10 from left to right.

An electric current which flows in the reactor 10 from left flows through a rectifier element 30b from below to above.

Next, when the MOSFET 100a is turned on, a source potential of the MOSFET 100a is rapidly increased, and a drain potential of the MOSFET 100b is also rapidly increased simultaneously with the rapid increase of the source potential of the MOSFET 100a. At this stage of operation, when a gate potential of the MOSFET 100b is pulled toward a drain potential, a plus bias is effectively applied between a gate and a source of the MOSFET 100b and hence, the MOSFET 100b is erroneously turned on. As a result, a state is brought about where the MOSFET 100a and the MOSFET 100b are simultaneously turned on. When the MOSFETs of upper and lower arms are simultaneously turned on, a short-circuit loop is formed from a positive pole to a negative pole of the power source 20 and hence, a through-current flows so that a circuit loss is increased.

As another example, assume a state where both the MOSFET 100a and the MOSFET 100b are in OFF states, and an electric current flows in the reactor 10 from right to left. An electric current which flows out leftward from the reactor 10 flows through a rectifier element 30a from below to above.

Next, when the MOSFET 100b is turned on, a drain potential of the MOSFET 100b is rapidly decreased, and a source potential of the MOSFET 100a is also rapidly decreased simultaneously with the rapid lowering of the drain potential of the MOSFET 100b.

At this stage, in the case where a gate potential of the MOSFET 100a is not simultaneously decreased with a source potential, a plus bias is effectively applied between a gate electrode and a source electrode of the MOSFET 100a and hence, the MOSFET 100a is erroneously turned on. Also in this case, a state is brought about where the MOSFET 100a and the MOSFET 100b are simultaneously turned on.

The above describes a phenomenon referred to as "false turn-on". That is, "false turn-on" is a phenomenon where, in a circuit where MOSFETs are connected to upper and lower arms respectively, when either one of the MOSFETs is turned on, the other MOSFET is also erroneously turned on due to a change in potential.

In the operation mechanism according to the present invention, when the MOSFET is turned off, the MOSFET is temporarily and spontaneously brought into a state where the MOSFET is almost turned on. That is, this state is an effect acquired at the time of turning off the MOSFET. Accordingly, this state, in principle, differs from "false turn-on" which occurs when the MOSFET is turned on.

Accordingly, in the present invention, there is no possibility that a through-current flows so that a circuit loss is increased.

In the chopper circuits described in Embodiment 1, Modification 1, and Modification 2 (see FIG. 1, FIG. 10 and FIG. 11), there may be a case where a rectifying function of the rectifier element 30 is exchanged with a built-in diode of a MOSFET different from the MOSFET 100 for introducing a synchronous rectification. In this case, two MOSFETs are connected in series thus giving rise to a possibility that "false turn-on" occurs.

However, also in this case, "false turn-on" occurs in response to turning on of either one of two MOSFETs and hence, this phenomenon also, in principle, differs from an effect obtained at the time of turning off the MOSFET in the present invention.

Although the present invention has been described based on the above-mentioned embodiments, the present invention is not limited to the above-mentioned embodiments. The present invention can be carried out in various modes without departing from the gist of the present invention and, for example, the following modifications are also possible.

(1) The number, materials, shapes, positions, sizes and the like of the constitutional elements described in the above-mentioned embodiments are provided for an exemplifying purpose, and these matters can be changed in various modes within a scope where advantageous effects of the present invention are not impaired.

(2) In the above-mentioned respective embodiments, in a depth direction of the p-type column region 116, a width of the p-type column region 116 is increased as the p-type column region 116 extends from a deep portion of the p-type column region 116 toward a surface of the p-type column region 116. However, the present invention is not limited to such a structure. The width of the p-type column region 116 may be set to a fixed value in the depth direction of the p-type column region 116.

Figure 20:
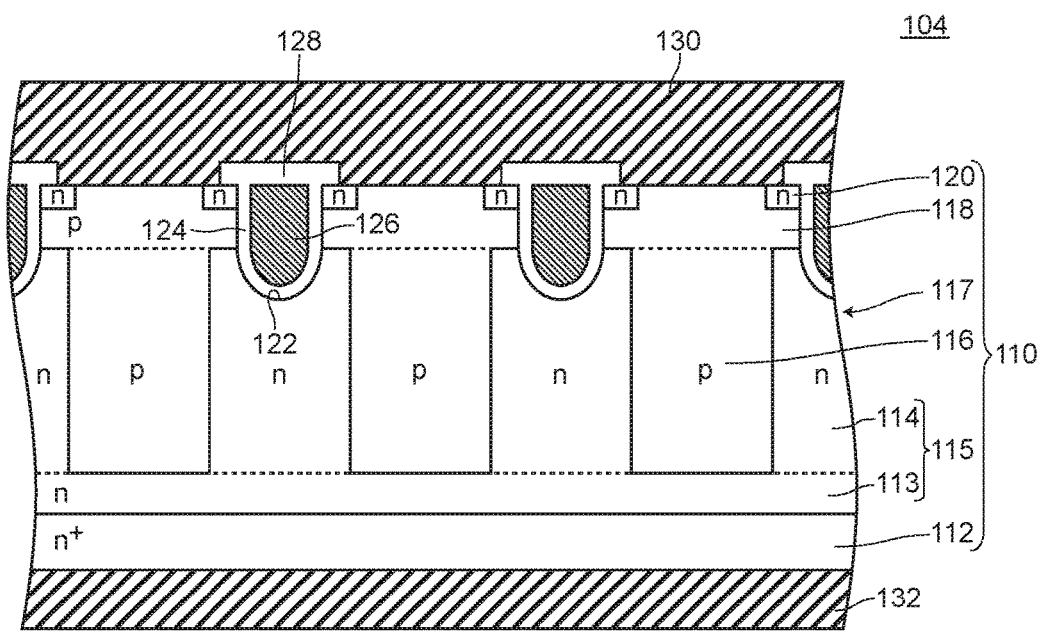
FIG. 20 is a cross-sectional view of a MOSFET 104 according to Modification 3.
Figure 21:
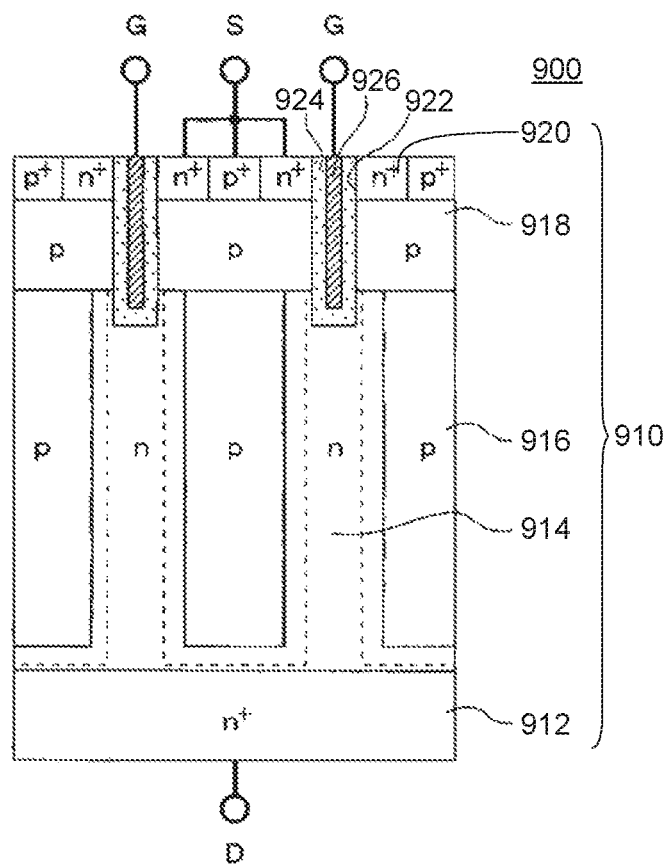
FIG. 21 is a cross-sectional view of a conventional MOSFET 900. Symbol 912 indicates a low-resistance semiconductor layer.

(3) In the above-mentioned respective embodiments, dopant concentration in the p-type column region 116 is set to a fixed value regardless of a depth of the p-type column region 116. However, the present invention is not limited to such a structure. In a depth direction of the p-type column region 116, dopant concentration in the p-type column region may be gradually increased as the p-type column region 116 extends from a deep portion of the p-type column region 116 toward a surface of the p-type column region 116 (see MOSFET 104 according to Modification 3, FIG. 20). In this case, a width of the p-type column region and a width of the n-type column region may be set to fixed values in a depth direction of the p-type column region (see FIG. 20) or a width of the p-type column region 116 may be increased gradually from a deep portion of the p-type column region 116 to a surface of the p-type column region 116. With such a structure, it is possible to acquire an advantageous effect where an L-load avalanche breakdown resistance can be increased.

(4) In the above-mentioned respective embodiments, the n-type column regions 114, the p-type column regions 116, the trenches 122, and the gate electrodes 126 are formed in a stripe shape as viewed in a plan view. However, the present invention is not limited to such a structure. The n-type column regions 114, the p-type column regions 116, the trenches 122, and the gate electrodes 126 may be formed in a circular shape (in a columnar shape as viewed stereoscopically), a quadrangular frame shape, a circular frame shape, a circular grid shape or the like as viewed in a plan view.

(5) In the above-mentioned respective embodiments, a DC power source is used as the power source. However, the present invention is not limited to such a structure. An AC power source may be also used as the power source.

(6) A chopper circuit is used as the power conversion circuit in the above-mentioned respective Embodiments 1 to 3, and a full bridge circuit is used as the power conversion circuit in the above-mentioned Embodiment 4. However, the present invention is not limited to such structures. As the power conversion circuit, a half bridge circuit, a three-phase AC converter, a non-insulation-type full bridge circuit, a non-insulation-type half bridge circuit, a push-pull circuit, an RCC circuit, a forward converter, a fly-back converter or other circuits may be used.

(7) A PIN diode is used as the rectifier element in the above-mentioned Embodiments 1 to 3, and a built-in diode of the MOSFET is used as the rectifier element in the above-mentioned Embodiment 4. However, the present invention is not limited to such structures. As the rectifier element, a JBS, a MPS, or other fast recovery diodes, a SiC Schottky barrier diode or other diodes may be used.

(8) In the above-mentioned Embodiment 4, only a built-in diode of the MOSFET is used as the rectifier element. However, the present invention is not limited to such a structure. When a recovery loss of the built-in diode is excessively large, a rectifier element provided as an additional part may be connected to the MOSFET in parallel.

EXPLANATION OF SYMBOLS 1, 2, 3, 4: power conversion circuit
10: reactor
12: first terminal
14: second terminal
20: power source
30: rectifier element
40: load
50: capacitor
100, 100a, 100b, 100c, 100d, 102, 104: MOSFET
110: semiconductor base substrate
112: low-resistance semiconductor layer
113: buffer layer
114: n-type column region
115: n-type semiconductor layer
116: p-type column region
118: base region
120: source region
122: trench
124, 134: gate insulation film
126, 136: gate electrode
128, 138: interlayer insulation film
130: source electrode
132: drain electrode
140: surface high concentration diffusion region

The invention claimed is:

1. A MOSFET used in a power conversion circuit which includes a power source and the MOSFET for controlling an electric current supplied from the power source, wherein
the MOSFET includes a semiconductor base substrate having an n-type column region and a p-type column region, the n-type column region and the p-type column region forming a super junction structure,
a total amount of a dopant in the p-type column region is set to a value which falls within a range of 1.00 to 1.03 times as much as a total amount of a dopant in the n-type column region, and
the MOSFET is configured to be operated during a period from a point of time when a drain current starts to decrease to a point of time when the drain current becomes 0 for the first time in response to turning off of the MOSFET such that a first period during which the drain current is decreased, a second period during which the drain current is increased or the drain current becomes constant, and a third period during which the drain current is decreased again occur in this order.

2. The MOSFET according to claim 1, wherein a decrease amount of the drain current per unit time during the third period is set to a value smaller than a decrease amount of the drain current per unit time during the first period.

3. The MOSFET according to claim 1, wherein
the semiconductor base substrate further includes:
a p-type base region formed on a surface of the n-type column region and a surface of the p-type column region; and an n-type source region formed on a surface of the base region, and
the MOSFET is a trench-gate-type MOSFET which further includes:
a trench where the trench is formed so as to reach a depth position deeper than a deepest portion of the base region in a region where the n-type column region is positioned as viewed in a plan view, and a portion of the source region is exposed on an inner peripheral surface of the trench; and
a gate electrode embedded in the inside of the trench by way of a gate insulation film formed on the inner peripheral surface of the trench.

4. The MOSFET according to claim 1, wherein the semiconductor base substrate further includes:
a p-type base region formed on a surface of a portion of the n-type column region and a whole surface of the p-type column region; and
an n-type source region formed on a surface of the base region, and
the MOSFET is a planar-gate-type MOSFET which further includes a gate electrode formed on the base region sandwiched between the source region and the n-type column region by way of a gate insulation film.

5. The MOSFET according to claim 4, wherein the total amount of the dopant in the p-type column region is set to a value which falls within a range of 1.00 to 1.02 times as much as the total amount of the dopant in the n-type column region.

6. The MOSFET according to claim 4, wherein the semiconductor base substrate further includes an n-type surface high concentration diffusion region formed on a portion of the surface of the n-type column region where the base region is not formed.

7. The MOSFET according to claim 1, wherein in the p-type column region, a width of the p-type column region is increased as the p-type column region extends away from a bottom surface of the semiconductor base substrate toward a surface of the p-type column region.

8. The MOSFET according to claim 1, wherein in the p-type column region, in a depth direction of the p-type column region, dopant concentration in the p-type column region is increased as the p-type column region extends from a deep portion of the p-type column region toward a surface of the p-type column region.

* * * * *